US010008596B2

(12) United States Patent
Balakrishnan et al.

(10) Patent No.: US 10,008,596 B2
(45) Date of Patent: *Jun. 26, 2018

(54) CHANNEL-LAST REPLACEMENT METAL-GATE VERTICAL FIELD EFFECT TRANSISTOR

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/297,345

(22) Filed: Oct. 19, 2016

(65) Prior Publication Data
US 2017/0179282 A1    Jun. 22, 2017

Related U.S. Application Data

(63) Continuation of application No. 14/970,977, filed on Dec. 16, 2015, now Pat. No. 9,525,064.

(51) Int. Cl.
*H01L 29/78* (2006.01)
*H01L 29/08* (2006.01)
(Continued)

(52) U.S. Cl.
CPC ...... *H01L 29/7827* (2013.01); *H01L 29/0847* (2013.01); *H01L 29/1037* (2013.01);
(Continued)

(58) Field of Classification Search
CPC .................................................. H01L 29/7827
See application file for complete search history.

(56) References Cited

U.S. PATENT DOCUMENTS

| 9,525,064 | B1 | 12/2016 | Balakrishnan et al. |
| 9,806,173 | B2 | 10/2017 | Balakrishnan et al. |
| 2008/0029809 | A1* | 2/2008 | Morioka ........... H01L 29/66242 257/329 |

OTHER PUBLICATIONS

List of IBM Patents or Patent Applications Treated As Related—Date Filed: Dec. 13, 2017; 2 pages.

* cited by examiner

*Primary Examiner* — Yu-Hsi D Sun
(74) *Attorney, Agent, or Firm* — Cantor Colburn LLP; Louis Percello

(57) ABSTRACT

A method of making a vertical transistor includes forming a doped source on a substrate; depositing a sacrificial gate material on the source; forming a trench in the sacrificial gate material to expose the doped source; growing an epitaxial layer within the trench to form a channel region extending from the doped source and through the sacrificial gate material; performing an epitaxial growth process to grow an epitaxial layer on a portion of the channel region to form a drain over the sacrificial gate material; depositing a dielectric material on the drain to form a spacer that protects the epitaxial growth; and removing the sacrificial gate material and replacing the sacrificial gate material with a gate stack that surrounds the channel region between the doped source and the drain.

5 Claims, 20 Drawing Sheets

(51) Int. Cl.
*H01L 29/10* (2006.01)
*H01L 29/423* (2006.01)
*H01L 29/66* (2006.01)

(52) U.S. Cl.
CPC .. *H01L 29/42356* (2013.01); *H01L 29/66545* (2013.01); *H01L 29/66666* (2013.01)

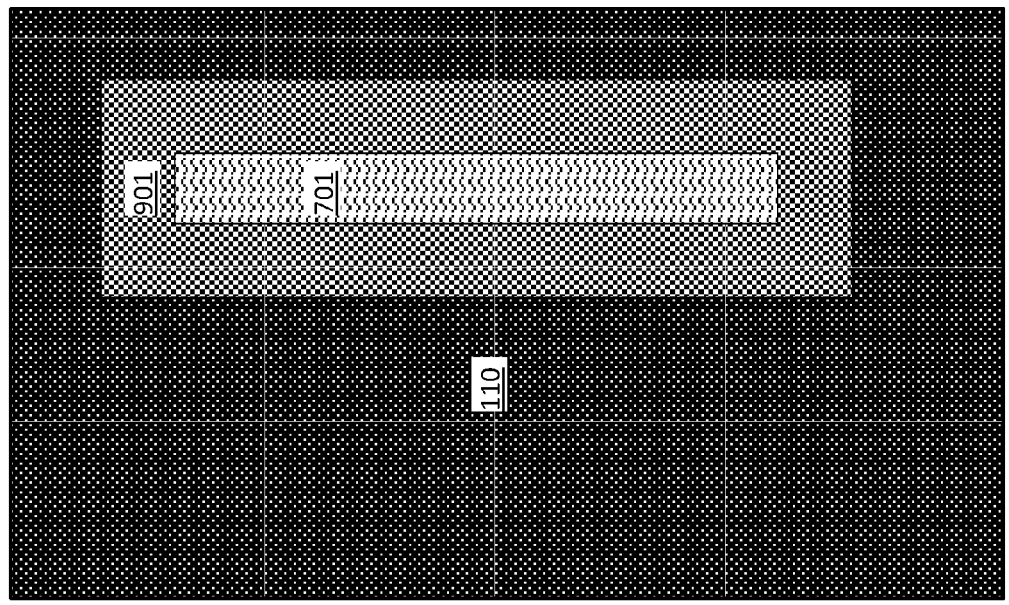
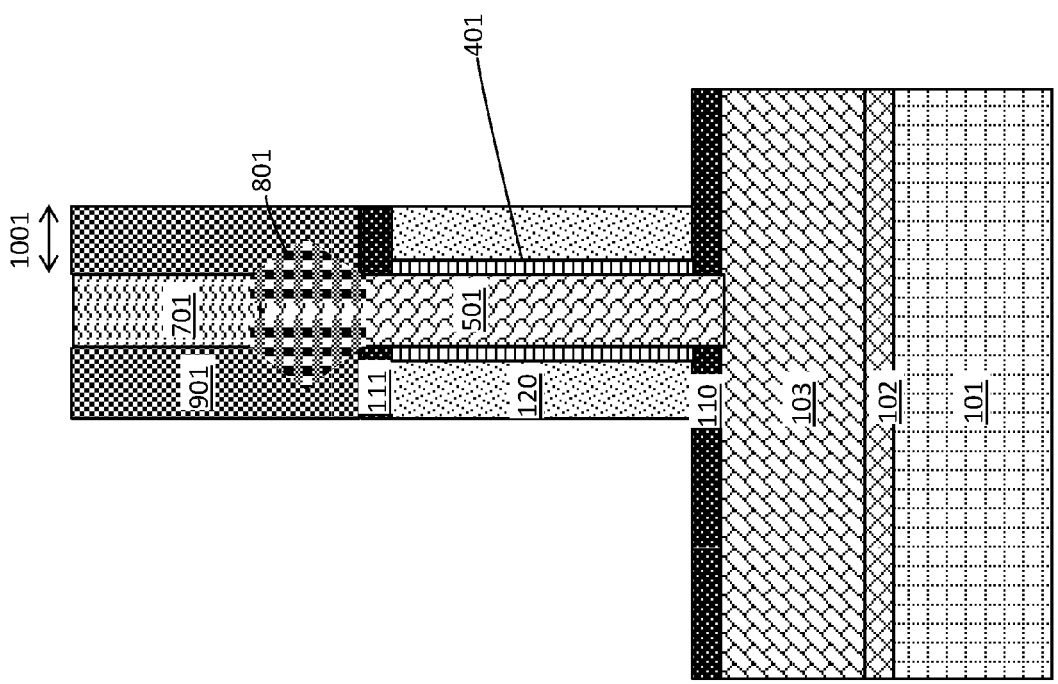

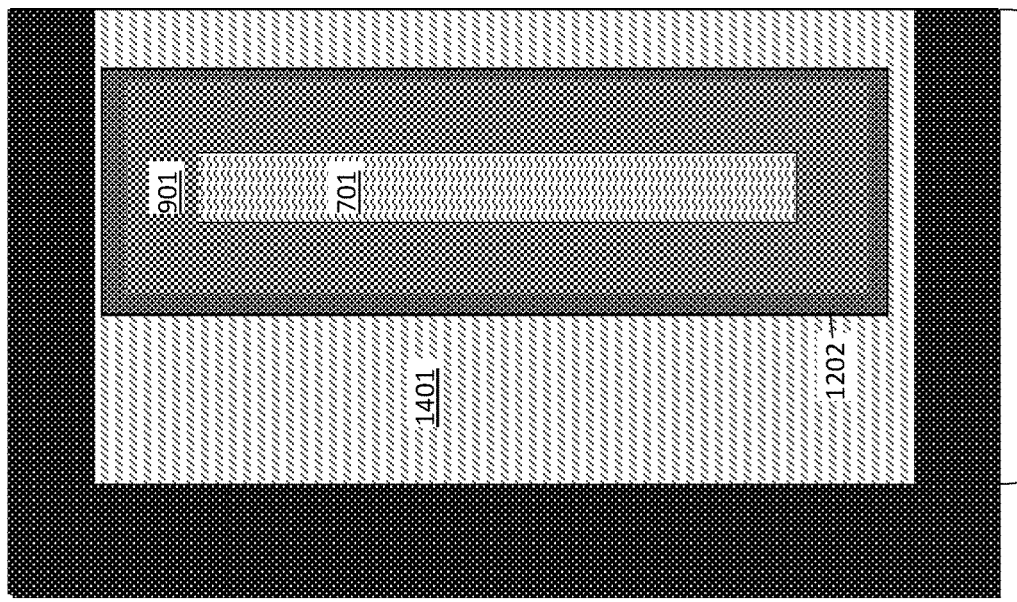
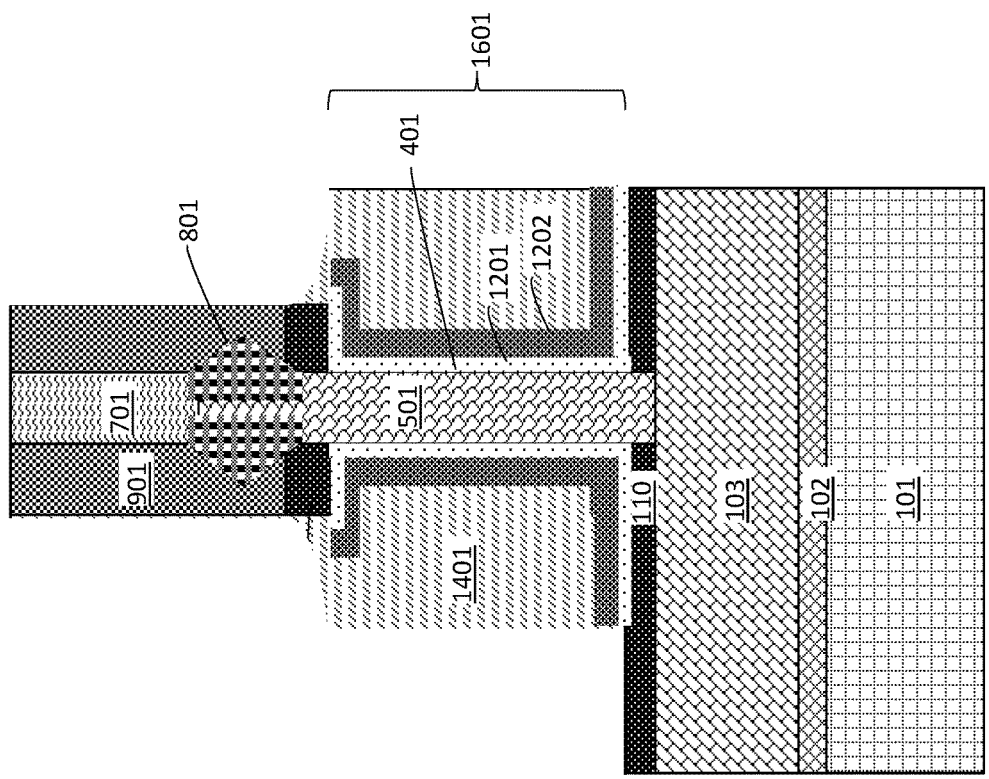

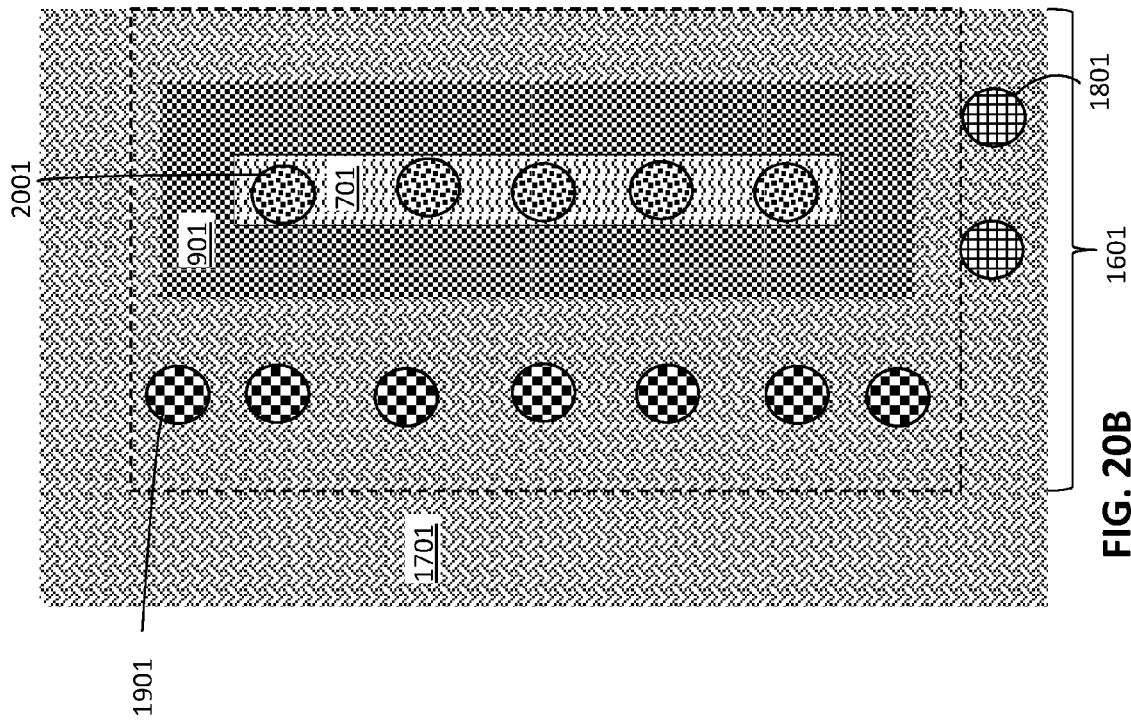
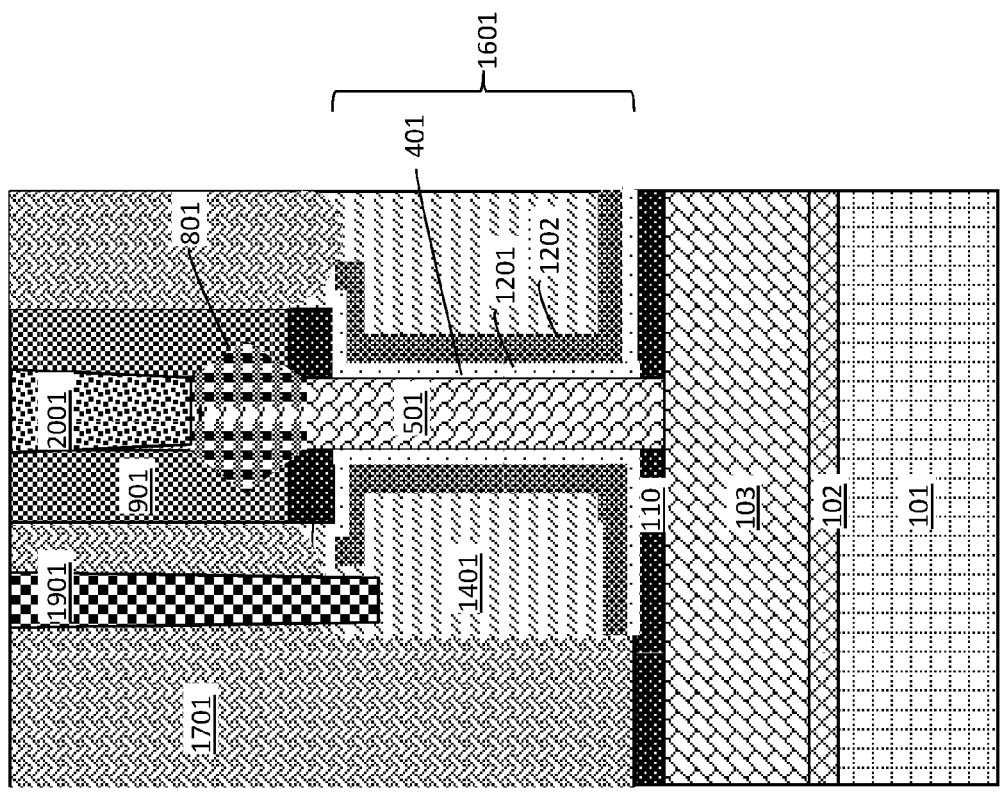

US 10,008,596 B2

CHANNEL-LAST REPLACEMENT METAL-GATE VERTICAL FIELD EFFECT TRANSISTOR

DOMESTIC PRIORITY

This application is a continuation of and claims priority from U.S. patent application Ser. No. 14/970,977, filed on Dec. 16, 2015, entitled "CHANNEL-LAST REPLACEMENT METAL-GATE VERTICAL FIELD EFFECT TRANSISTOR," the entire contents of which are incorporated herein by reference.

BACKGROUND

The present invention relates to complementary metal oxide semiconductor (CMOS), and more specifically, to vertical transistors.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

SUMMARY

According to an embodiment, a method of making a vertical transistor includes forming a doped source on a substrate; depositing a sacrificial gate material on the source; forming a trench in the sacrificial gate material to expose the doped source; growing an epitaxial layer within the trench to form a channel region extending from the doped source and through the sacrificial gate material; performing an epitaxial growth process to grow an epitaxial layer on a portion of the channel region to form a drain over the sacrificial gate material; depositing a dielectric material on the drain to form a spacer that protects the epitaxial growth; and removing the sacrificial gate material and replacing the sacrificial gate material with a gate stack that surrounds the channel region between the doped source and the drain.

According to another embodiment, a method of making a vertical transistor includes forming a doped source on a substrate; depositing a sacrificial gate material on the source, the sacrificial gate material arranged between a first spacer disposed on the doped source and a second spacer disposed on the sacrificial gate material; forming a trench in the sacrificial gate material, the first spacer, and the second spacer to expose the doped source; growing an epitaxial layer within the trench to form a channel region extending from the doped source and through the sacrificial gate material; performing an epitaxial growth process to grow an epitaxial layer on a portion of the channel region to form a drain over the sacrificial gate material; depositing a dielectric material on the drain to form a spacer that protects the epitaxial growth; removing a portion of the sacrificial gate material and the second spacer that extends horizontally beyond the spacer arranged over the drain; removing remaining portions of the sacrificial gate material such that a portion of the second spacer remains beneath the spacer over the drain; and depositing a gate stack that surrounds the channel region between the doped source and the drain.

Yet, according to another embodiment, a vertical transistor includes a source arranged on a substrate; a channel region extending over the source and comprising an epitaxial growth; a drain comprising an epitaxial growth arranged on the channel region, the channel region extending from the source to the drain; a gate disposed on and around the channel region; and a spacer arranged on the gate and around the drain.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-20B illustrate exemplary methods of making a vertical transistor according to embodiments, in which:

FIGS. 1A and 1B are a cross-sectional side view and a top view, respectively, of a dummy gate and dielectric capping layer arranged on a substrate;

FIGS. 10A and 10B are a cross-sectional side view and a top view, respectively, after removing a portion of the second spacer and dummy gate;

FIGS. 16A and 16B are a cross-sectional side view and a top view, respectively, after performing gate lithography and etching to form the gate;

FIGS. 20A and 20B are a cross-sectional side view and a top view, respectively, after forming drain contacts.

DETAILED DESCRIPTION

When a MOSFET is scaled down through various technology nodes, several techniques may employed to improve device performance. One technique for scaling for 5 nanometer (nm) devices and beyond is to form a vertical transistor. Vertical transistors may have longer gates, which can improve performance.

Vertical transistors may be formed using a channel-first process flow, which means that the gate length and spacer thicknesses are defined by reactive ion etch (ME) and/or chemical mechanical planarization (CMP). However, one challenge of forming a vertical transistor using these methods is that there may be variations in the gate length, spacer thickness, and extension doping profile due to the integration challenges posed by the vertical orientation of the transistor.

Accordingly, various embodiments provide a channel-last replacement metal gate all-around vertical transistor. The gate lengths and spacer thickness are predefined, and therefore, well-controlled and do not depend on etch or chemical mechanical planarization (CMP) processes. The source side extension is also well-controlled by tuning the doping concentration during the channel epitaxial growth.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 1B:
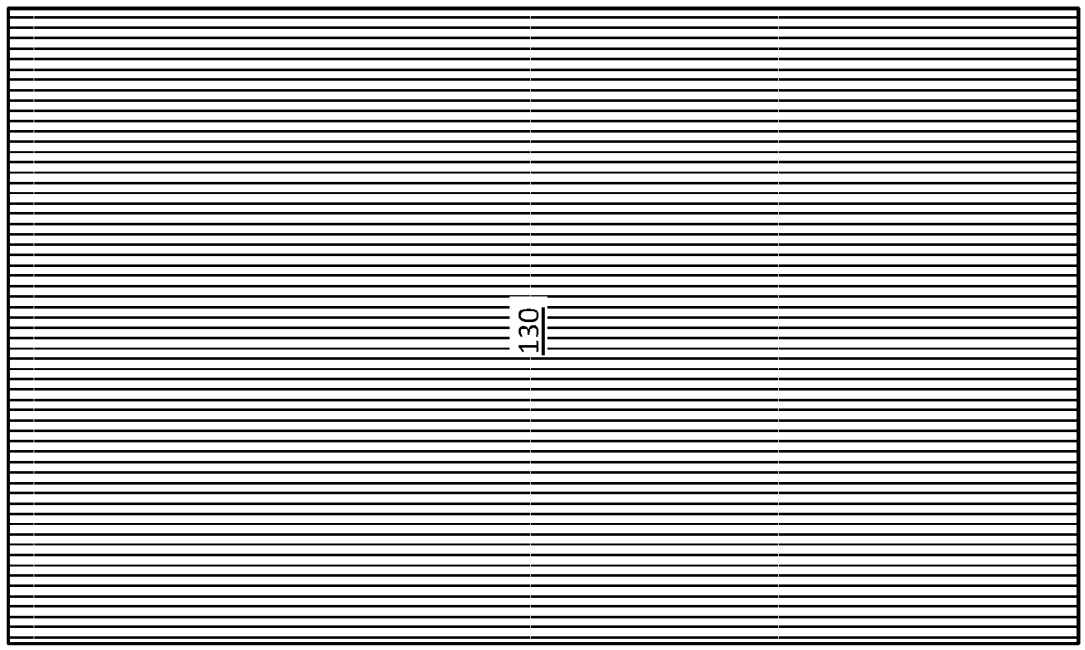
Figure 1A:
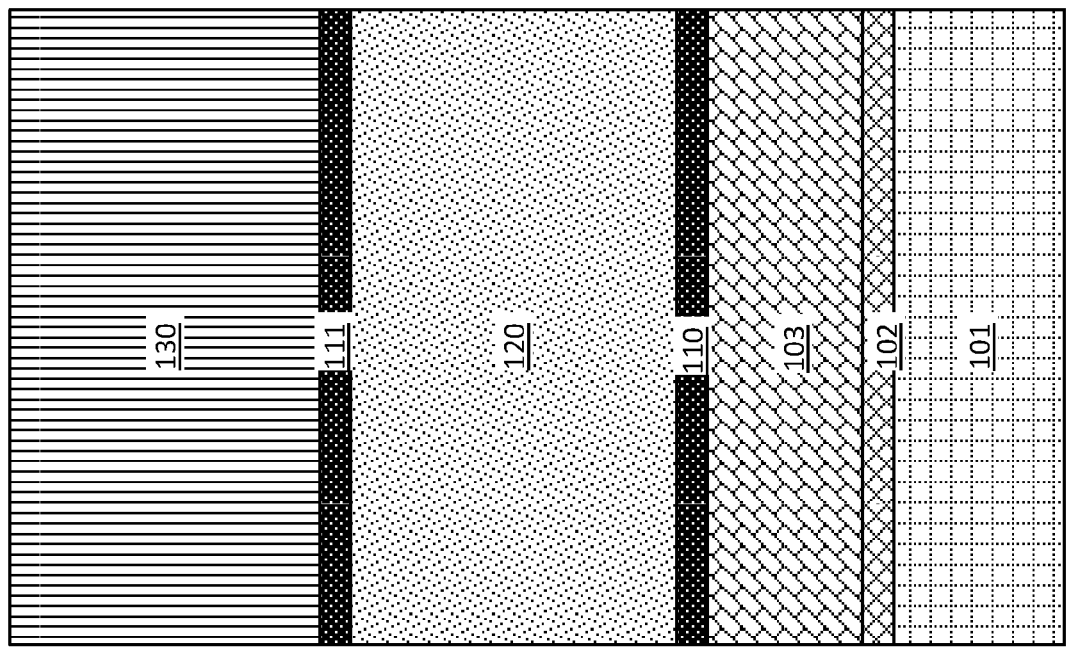

Turning now to the Figures, FIGS. 1A-20B illustrate exemplary methods of making a vertical transistor according to embodiments. FIGS. 1A and 1B are a cross-sectional side view and a top view, respectively, of a dummy gate 120 and dielectric capping layer 130 arranged on a substrate 101 (bulk substrate). The substrate 101 includes one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. In an exemplary embodiment, the substrate 101 includes germanium so that the channel region has both electron and hole mobility properties.

The doped source 103 is arranged on the substrate 101 over a counter-doped layer 102. The doped source 103 and the counter-doped layer 102 are formed on the substrate 101 incorporating dopants into the substrate 101 or forming an epitaxial growth on the substrate 101. The doped source 103 is heavily doped with a dopant, which may be a p-type dopant (e.g., boron or gallium) or an n-type dopant (e.g., phosphorus or arsenic). The counter-doped layer 102 includes a dopant that is different/opposite the dopant in the doped source 103. For example, when the doped source 103 includes a p-type dopant, the counter-doped layer 102 includes an n-type dopant, and when the doped source 103 includes an n-type dopant, the counter-doped layer 102 includes a p-type dopant. The doped source 103 is heavily doped, including a dopant concentration in a range from about $10^{19}$ to about $10^{22}$ atoms/cm$^3$. The thickness of the counter-doped layer may be in a range from about 5 to about 50 nm, or from about 10 to about 20 nm. The thickness of the doped source 103 may be in a range from about 50 to about 250 nm, or from about 100 to about 200 nm.

A dummy gate 120 is disposed on the doped source 103 between a first spacer 110 and a second spacer 111. The first spacer 110 is deposited on the doped source 103, the dummy gate 120 is deposited on the first spacer 110, and the second spacer 111 is deposited on the dummy gate 120.

The first spacer 110 and second spacer 111 may include an insulating material, for example, silicon dioxide, silicon nitride, SiOCN, or SiBCN. Other non-limiting examples of materials for the first spacer 110 and the second spacer 111 include dielectric oxides (e.g., silicon oxide), dielectric nitrides (e.g., silicon nitride), dielectric oxynitrides, or any combination thereof. The first spacer 110 and second spacer 111 materials are deposited by a deposition process, for example, chemical vapor deposition (CVD) or physical vapor deposition (PVD). The first spacer 110 and the second spacer 111 may each have a thickness of about 3 to about 15 nm, or of about 5 to about 10 nm.

The dummy gate 120 includes a sacrificial gate material, for example, amorphous silicon (aSi) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 120 has a thickness of about 8 to about 100, or from about 10 to about 30 nm.

A dielectric capping layer 130 is deposited on the second spacer 111 over the dummy gate 120. Non-limiting examples of materials for the dielectric capping layer 130 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 130 has a thickness in a range from about 30 to about 200 nm, or from about 50 to about 100 nm.

Figure 2B:
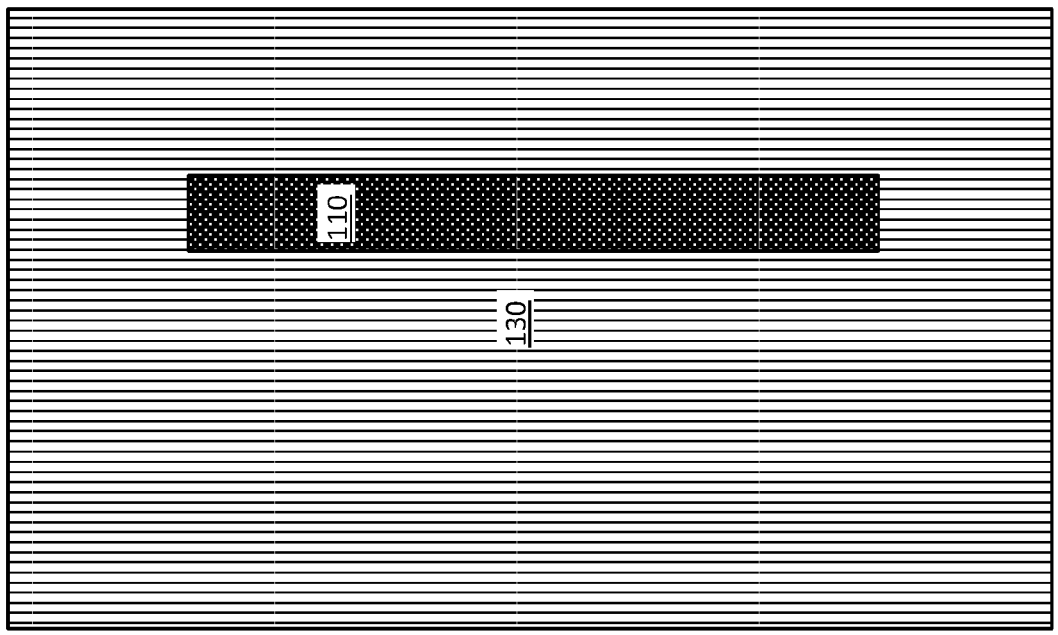
FIGS. 2A and 2B are a cross-sectional side view and a top view, respectively, after forming a trench through the dielectric capping layer and the dummy gate to expose the first spacer.
Figure 2A:
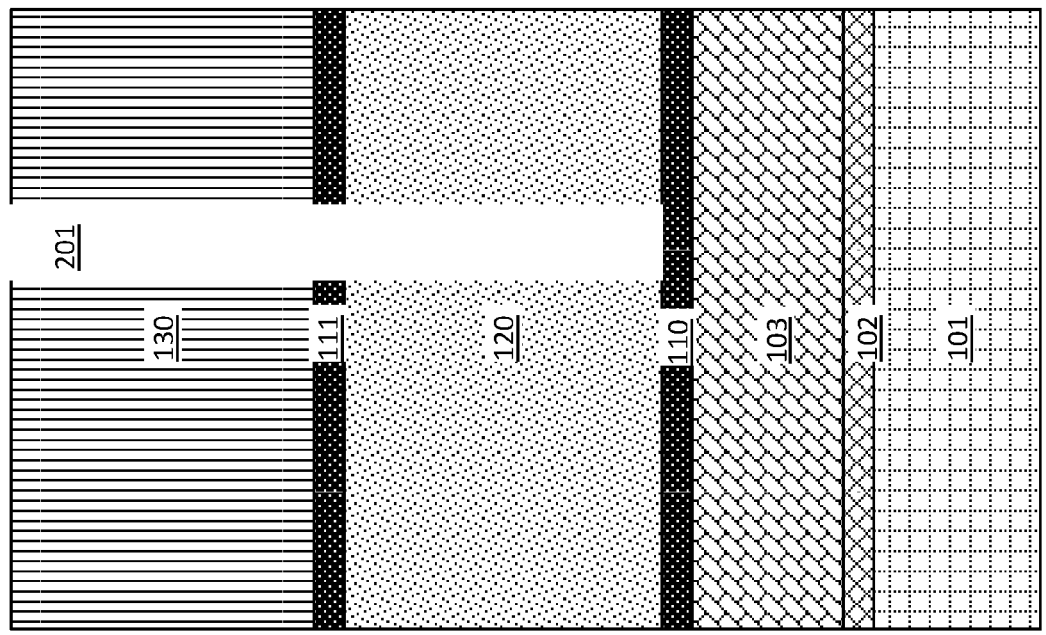

FIGS. 2A and 2B are a cross-sectional side view and a top view, respectively, after forming a trench 201 through the dielectric capping layer 130, second spacer 111, and the dummy gate 120 to expose the first spacer 110. The trench 201 extends from a surface of the dielectric capping layer 130 to the first spacer 110, exposing the first spacer 110. The trench 201 is formed by performing an etch process that is selective to (will not substantially remove) the first spacer 110 material. The etch process may be, for example, a reactive ion etch. Multiple etching processes are performed to form an opening/trench within the structure. For example, a first etching process is performed to remove a portion of the dielectric capping layer 130 selective to the material of the second spacer 111. A second etching process is then performed to remove a portion of the second spacer 111, which underlies the portion of the trench 201 formed from the first etching process, selective to the material of the dummy gate 120. A third etching process is then performed to remove a portion of the dummy gate 120, which underlies the portion of the trench 201 formed from the second etching process, selective to the material of the first spacer 110. The resulting trench 201 extends through a top surface of the dielectric capping layer 130 down to a top surface of an exposed portion of the first spacer 110. The width of the trench 201 may be about 3 to about 20 nm, or about 5 to about 10 nm. The depth of the trench 201 may be about 50 to about 300 nm, or from about 100 to about 200 nm.

Figure 3B:
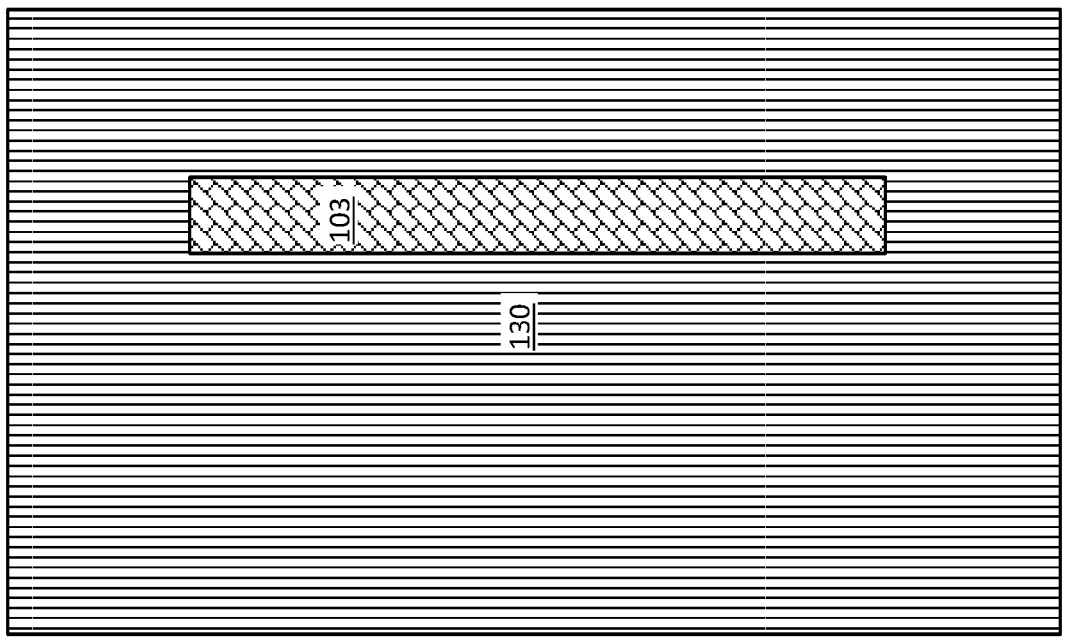
FIGS. 3A and 3B are a cross-sectional side view and a top view, respectively, after etching through the first spacer to expose the doped source.
Figure 3A:
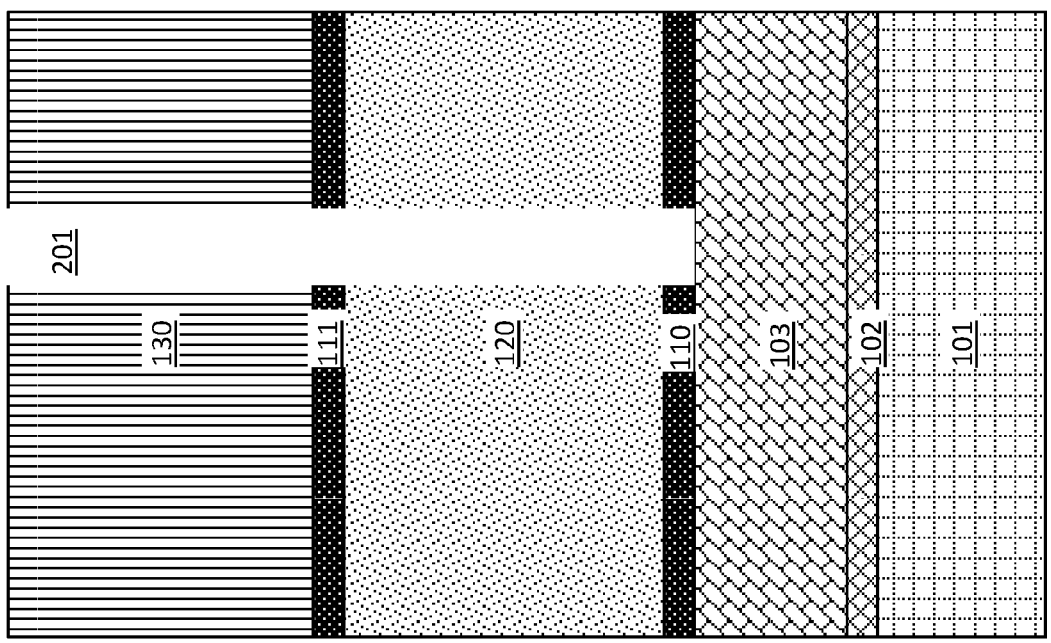

FIGS. 3A and 3B are a cross-sectional side view and a top view, respectively, after etching through the first spacer 110 to expose the doped source 103 and form a self-aligned junction. The first spacer 110 may etched using a process that is selective to (will not substantially remove) the doped source 103 material. The first spacer 110 may be etched by, for example, a reactive ion etch (ME). The exposed portion of the first spacer 110 is removed by an etching process to expose a portion of the underlying source contact layer. This creates a self-aligned junction because a source extension can be epitaxially grown from the source layer to a top surface of the first spacer layer.

Figure 4B:
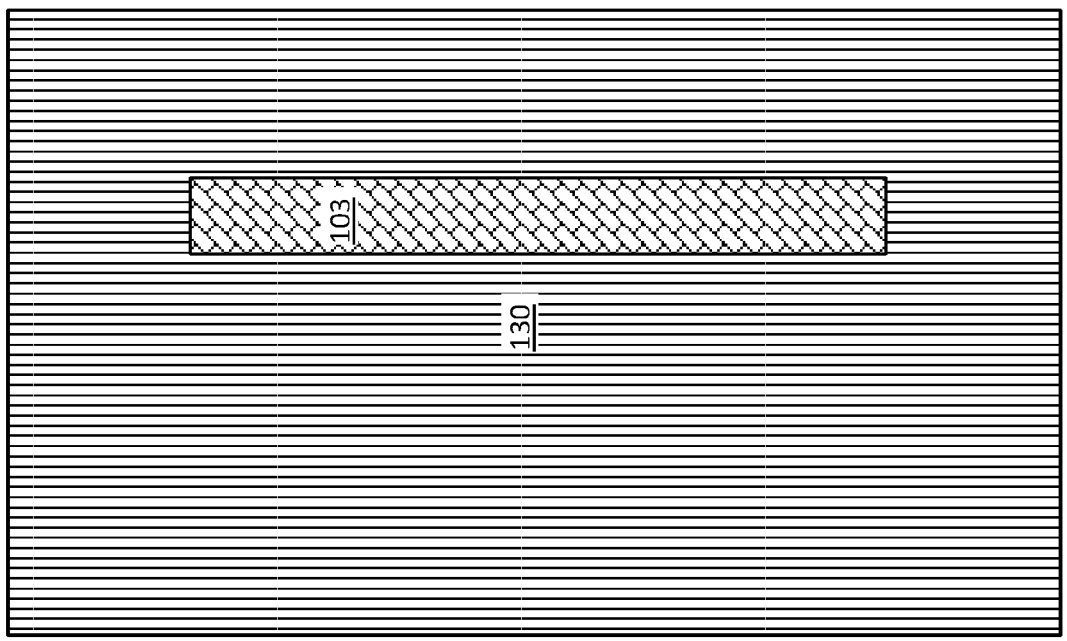
FIGS. 4A and 4B are a cross-sectional side view and a top view, respectively, after oxidizing a portion of the dummy gate sidewall.
Figure 4A:
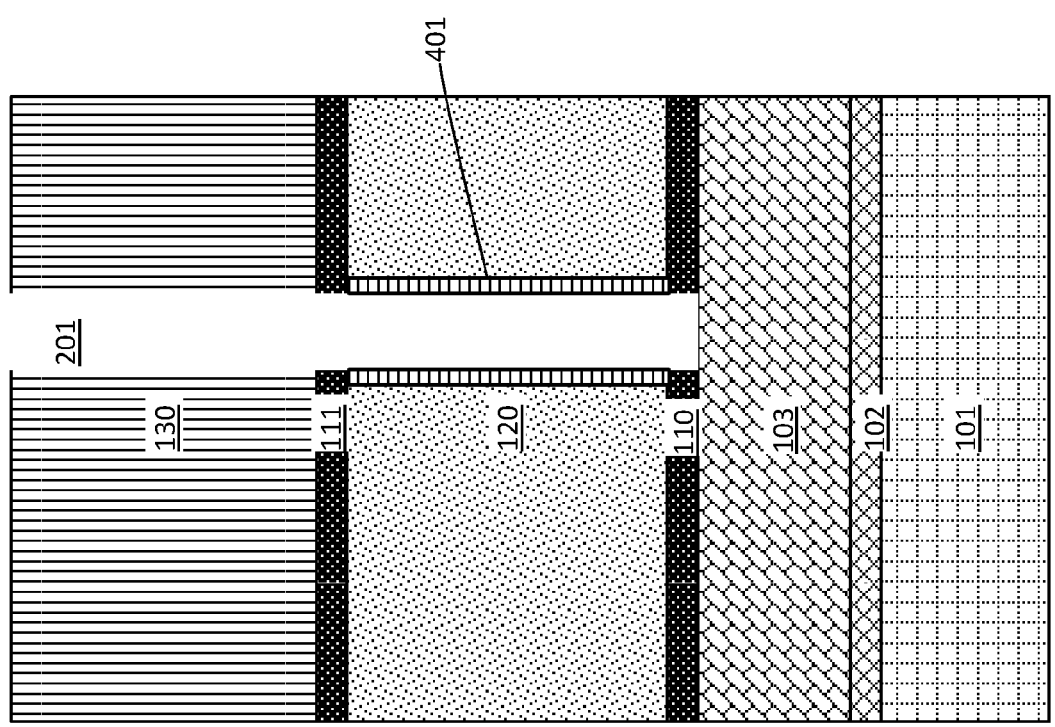

FIGS. 4A and 4B are a cross-sectional side view and a top view, respectively, after oxidizing a portion of the dummy gate 120 sidewall. A thin layer of oxide 401 is formed along the sidewall. The oxidation may be performed by a plasma oxidation process or other oxidation process that forms a thin oxide 401 layer. A portion of the first spacer 110 or the doped source 103 also may be oxidized. Any oxide formed in these regions is removed before performing the epitaxial growth (see FIGS. 5A and 5B).

Figure 5B:
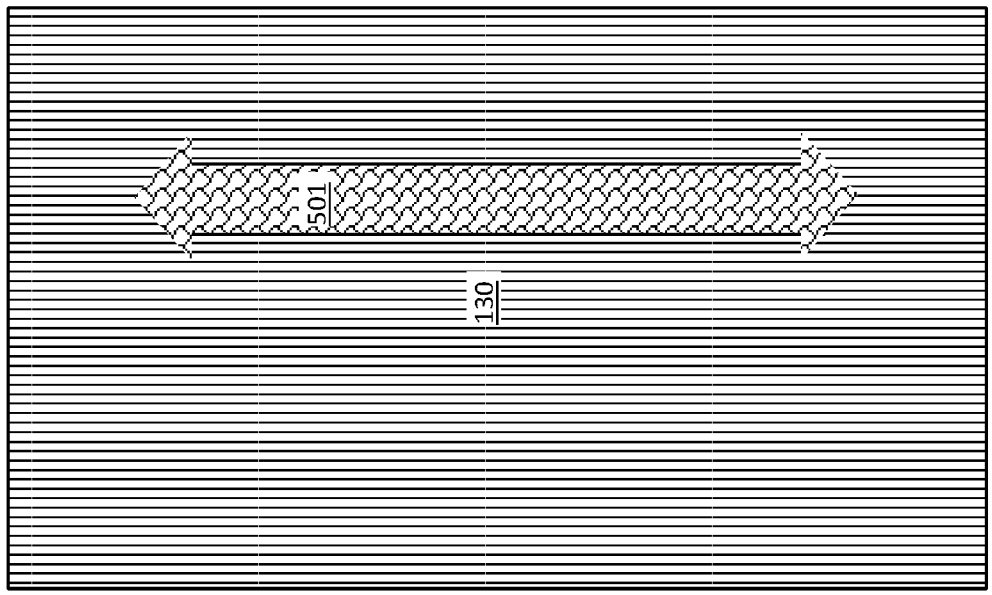
FIGS. 5A and 5B are a cross-sectional side view and a top view, respectively, after growing an epitaxial layer within the trench to from a channel region.
Figure 5A:
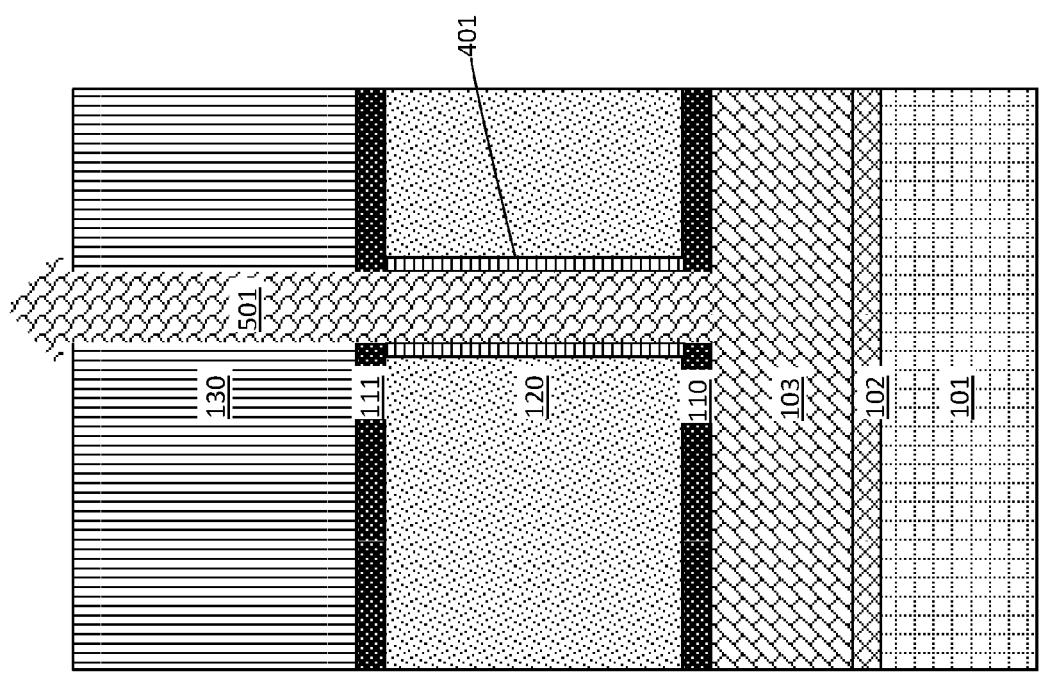

FIGS. 5A and 5B are a cross-sectional side view and a top view, respectively, after growing an epitaxial layer on the doped source 103 after removing the oxide 401 to form the epitaxial channel 501 (channel region). The epitaxial growth includes an epitaxial semiconductor material, and the epitaxial growth and/or deposition processes are selective to forming on semiconductor surface, and do not deposit material on other surfaces, such as the oxide 401, first spacer 110 or second spacer 111. The epitaxial growth in the epitaxial channel 501 extends over the dielectric capping layer 130.

The epitaxial channel 501 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial channel material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Figure 6B:
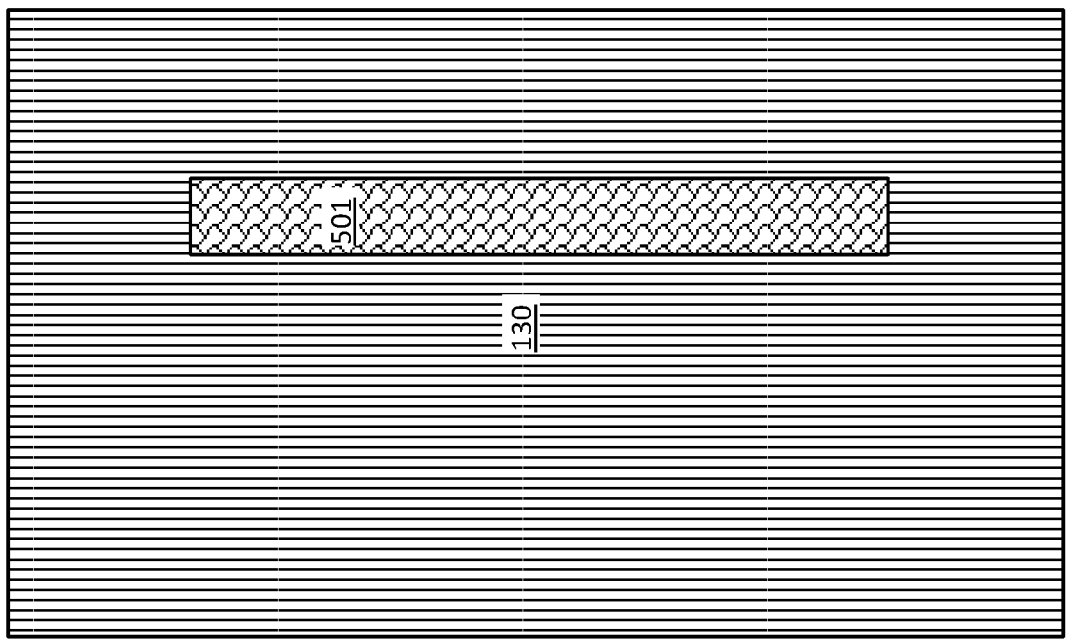
FIGS. 6A and 6B are a cross-sectional side view and a top view, respectively, after planarizing the epitaxial layer.
Figure 6A:
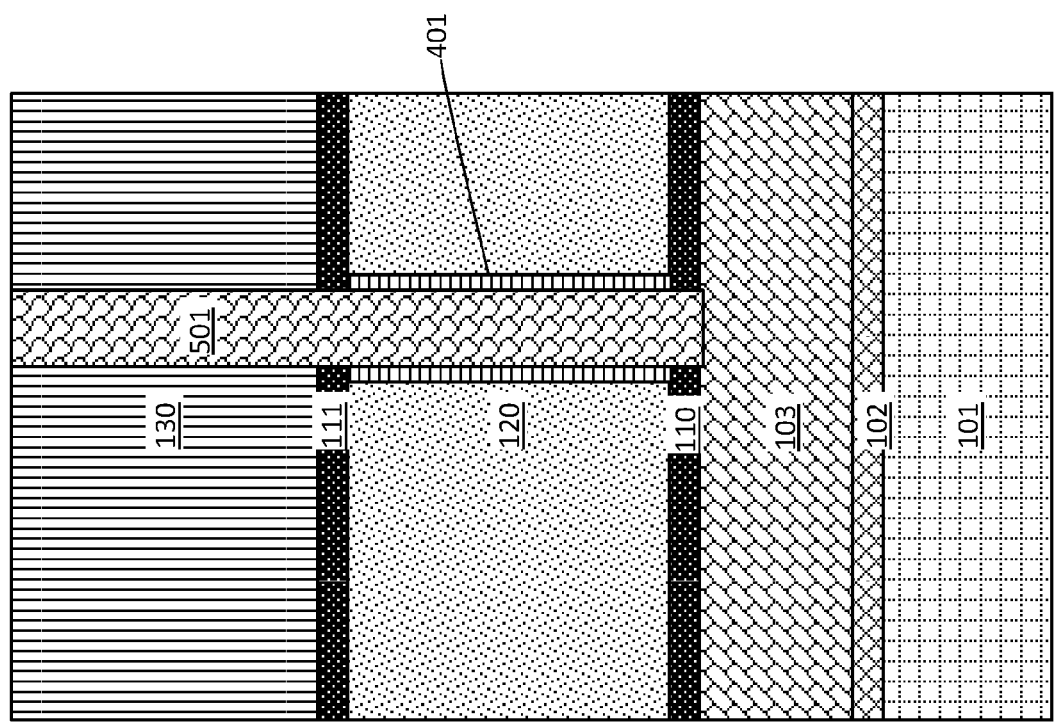

FIGS. 6A and 6B are a cross-sectional side view and a top view, respectively, after planarizing the epitaxial growth in the epitaxial channel 501. The planarization process may be a CMP process. Planarization removes excess epitaxial growth over the dielectric capping layer 130.

Figure 7B:
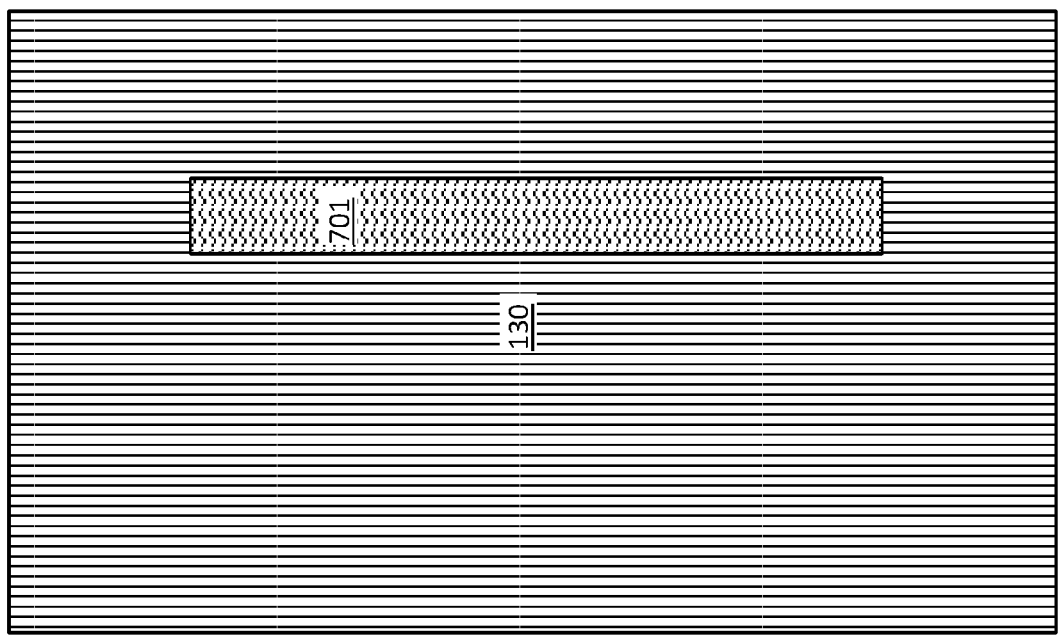
FIGS. 7A and 7B are a cross-sectional side view and a top view, respectively, after partially recessing the epitaxial layer, filling with a dielectric material, and planarizing.
Figure 7A:
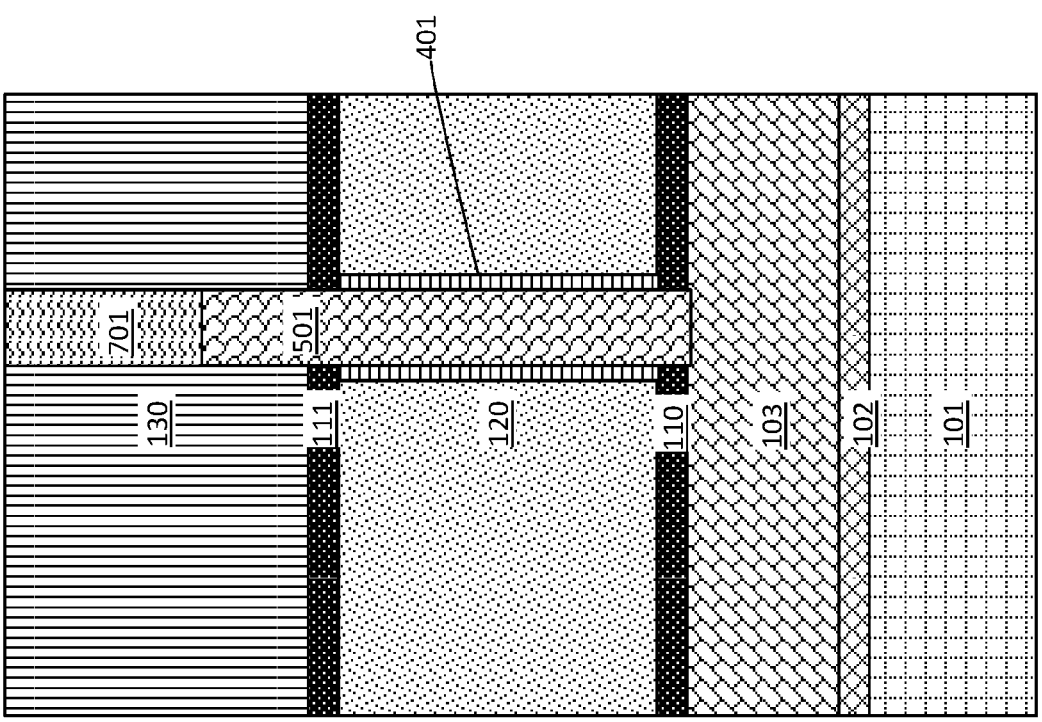

FIGS. 7A and 7B are a cross-sectional side view and a top view, respectively, after partially recessing the epitaxial channel 501, filling with a dielectric material 701, and planarizing the dielectric material 701. The epitaxial channel 501 is partially recessed to a level that is still within the dielectric capping layer 130 and over the second spacer 111. The epitaxial channel 501 is recessed by etching, for example, by a reactive ion etch or a wet etch process.

The recessed formed over the recessed epitaxial channel 501 is filled with a dielectric material. The dielectric material 701 may be a dielectric oxide (e.g., silicon oxide), a dielectric nitride (e.g., silicon nitride), a dielectric oxynitride, or any combination thereof. The dielectric material 701 is deposited by a deposition process, for example, chemical vapor deposition (CVD) or physical vapor deposition (PVD). After deposition, the dielectric 701 is planarized, by for example, CMP. The dielectric material 701 forms a dielectric cap.

Figure 8B:
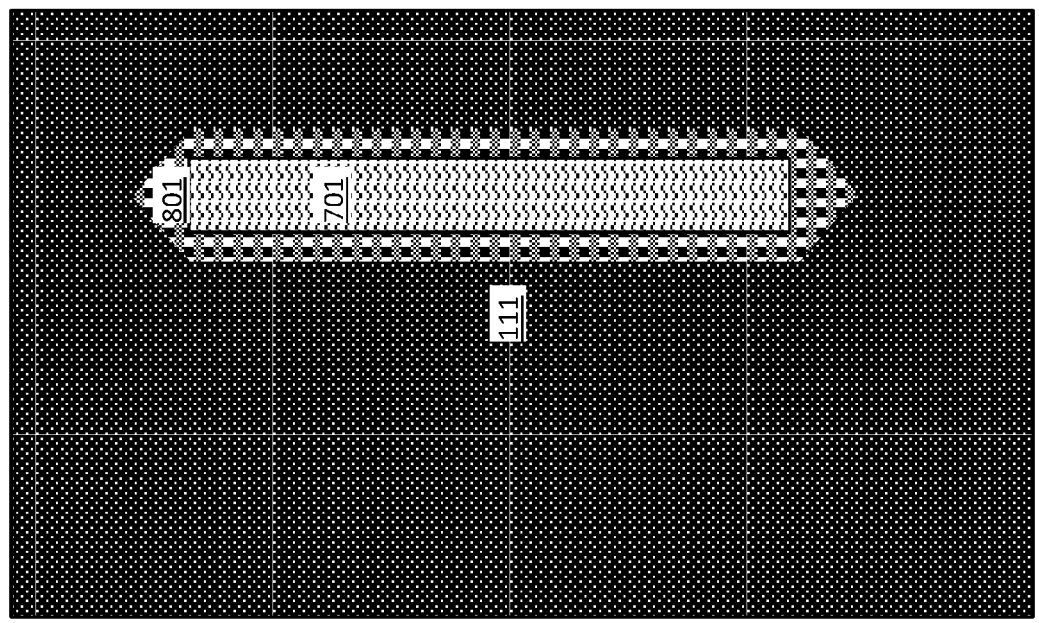
FIGS. 8A and 8B are a cross-sectional side view and a top view, respectively, after removing the oxide and forming an epitaxial growth on the epitaxial layer to form a drain.
Figure 8A:
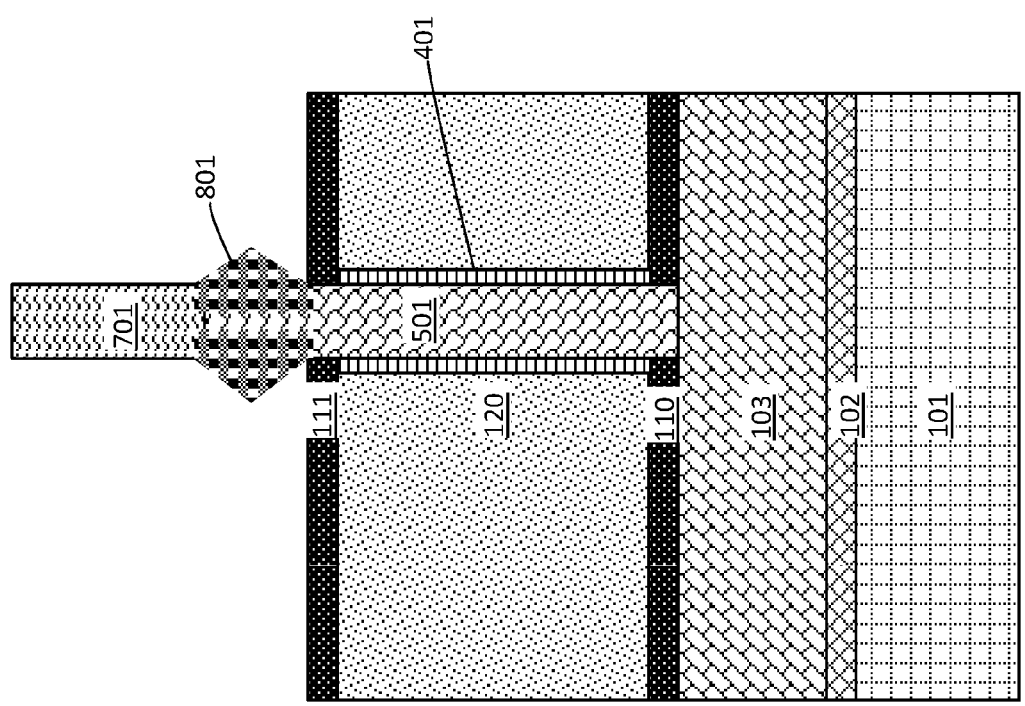

FIGS. 8A and 8B are a cross-sectional side view and a top view, respectively, after removing the dielectric capping layer 130 and forming an epitaxial growth 801 on the epitaxial channel 501 to form a drain. The epitaxial growth 801 of the drain is arranged between the dielectric material 701 and the epitaxial channel 501. The epitaxial growth 801 is also arranged between the dielectric cap and the dummy gate 120. A portion of the epitaxial channel 501 over the second spacer 111 may be recessed along sidewalls before forming the epitaxial growth 801. The epitaxial growth 801 forms the source/drain. The epitaxial growth may be performed as described above in FIGS. 5A and 5B.

Figure 9B:
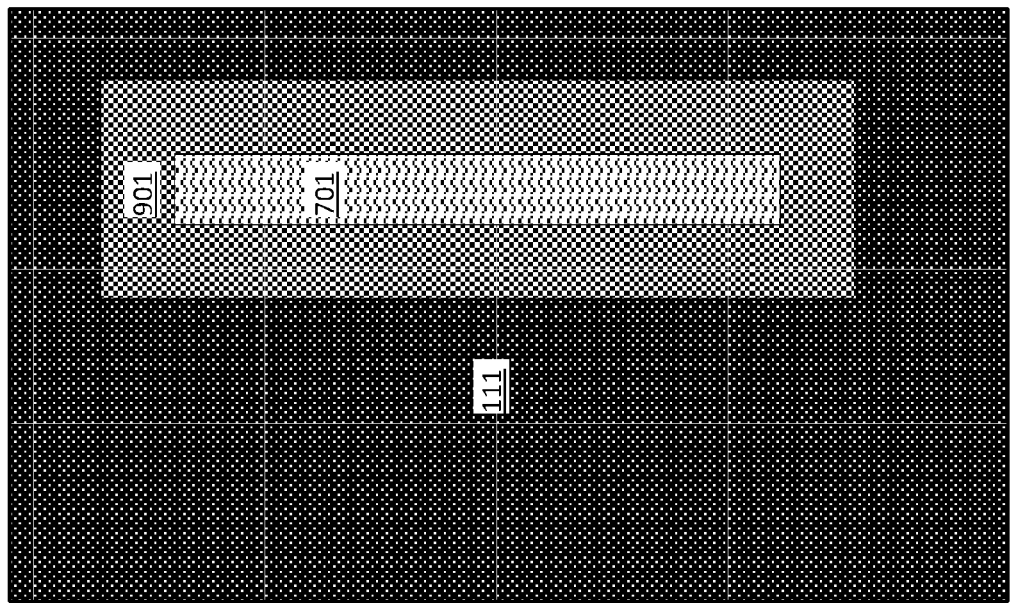
FIGS. 9A and 9B are a cross-sectional side view and a top view, respectively, after depositing a spacer on the epitaxial growth.
Figure 9A:
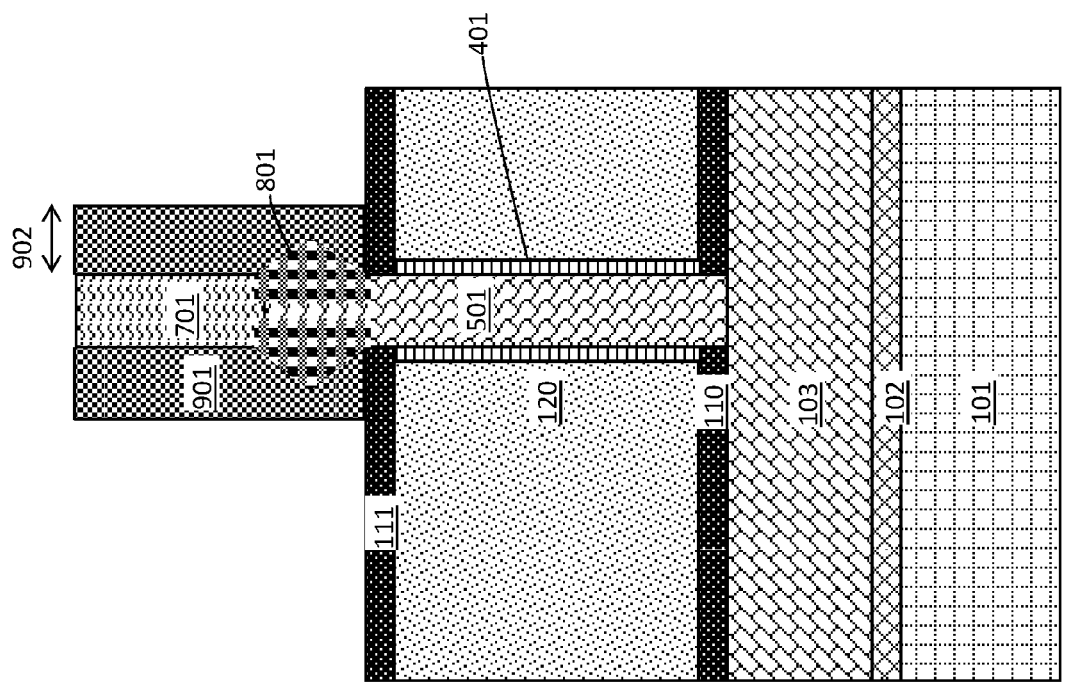

FIGS. 9A and 9B are a cross-sectional side view and a top view, respectively, after depositing a spacer 901 on the epitaxial growth 801. The spacer 901 protects the epitaxial growth 801 of the drain. The spacer 901 is also disposed on a sidewall of the dielectric material 701. The spacer 901 includes an insulating material, for example, dielectric oxides (e.g., silicon oxide), dielectric nitrides (e.g., silicon nitride), dielectric oxynitrides, or any combination thereof. The spacer 901 material is deposited by a deposition process, for example, chemical vapor deposition (CVD) or physical vapor deposition (PVD). The spacer material may be etched by a dry etch process, for example, a RIE process, such that it covers the epitaxial growth 801 and is removed from a surface of the dielectric material 701 and the second spacer 111. The spacer 901 has a width 902 of about 5 to about 50 nm, or from about 15 to about 30 nm.

FIGS. 10A and 10B are a cross-sectional side view and a top view, respectively, after removing a portion of the second spacer 111 and dummy gate 120. The second spacer 111 and the dummy gate material 120 are recessed to removed portions that extend horizontally beyond the spacer 901 material. An etch process that is selective to (will not substantially remove) the first spacer 110 is performed. The etch process may be a dry etch process, such as an RIE process.

Figure 11B:
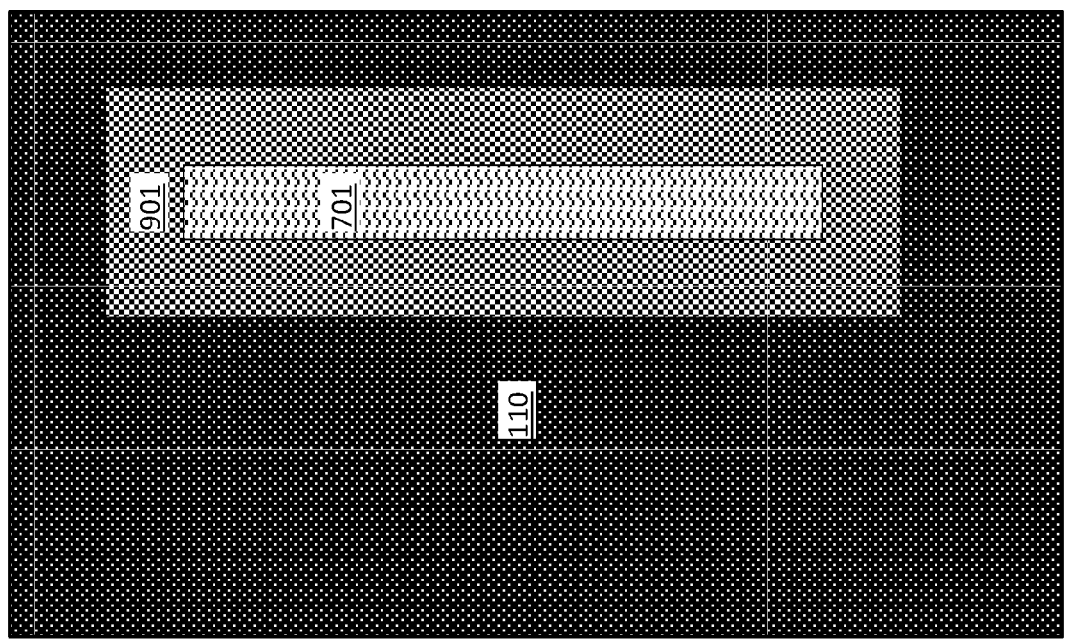
FIGS. 11A and 11B are a cross-sectional side view and a top view, respectively, after removing remaining portions of the dummy gate.
Figure 11A:
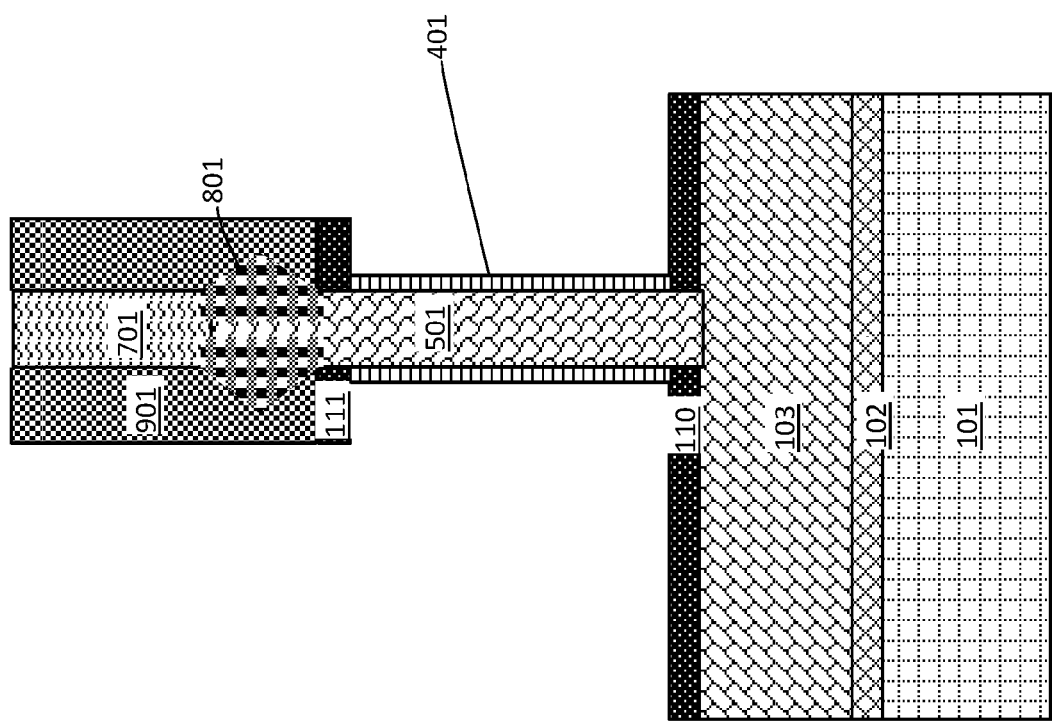

FIGS. 11A and 11B are a cross-sectional side view and a top view, respectively, after removing the remaining dummy gate 120 material beneath the spacer 901 to expose the oxide 401. The dummy gate 120 material may be removed by a wet etch process, for example, a process that includes hot ammonia.

Figure 12B:
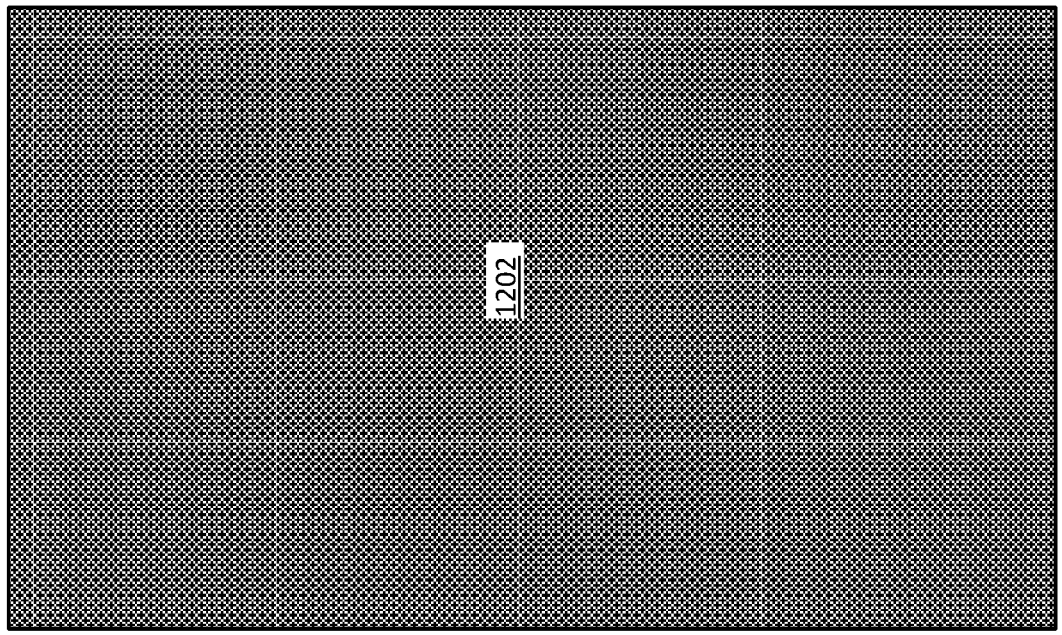
FIGS. 12A and 12B are a cross-sectional side view and a top view, respectively, after removing the dummy gate oxide layer and depositing a high-k material and a work function metal.
Figure 12A:
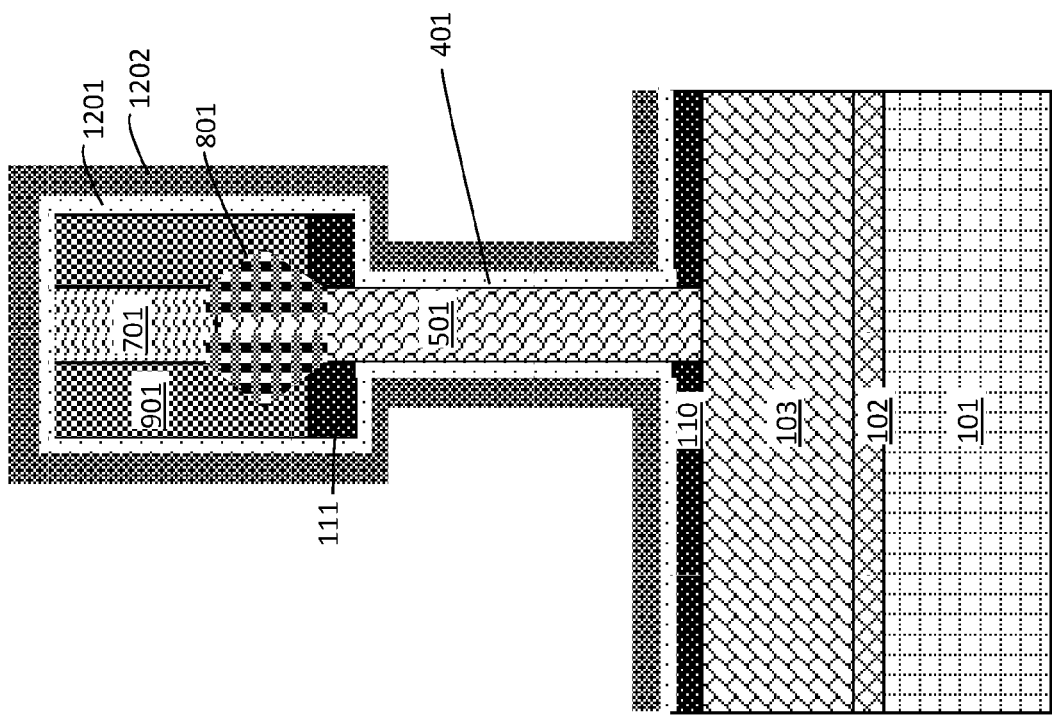

FIGS. 12A and 12B are a cross-sectional side view and a top view, respectively, after removing the dummy gate oxide 401 layer and depositing a gate dielectric material 1201 and a work function metal 1202. The dielectric material 1201 and the work function metal 1202 form a portion of the gate stack that replaces the dummy gate 120. The gate dielectric material 1201 and the work function metal 1202 are disposed on the first spacer 110, the epitaxial channel 501, the spacer 901, and remaining portions of the second spacer 111 beneath the epitaxial growth 801.

The gate dielectric material(s) can be a dielectric material having a dielectric constant greater than 3.9, 7.0, or 10.0. Non-limiting examples of suitable materials for the gate dielectric material 1201 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 1201 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 1201 may vary depending on the deposition process as well as the composition and number of high-k dielectric materials used.

The work function metal(s) 1202 may be disposed over the gate dielectric material 1201. The type of work function metal(s) 1202 depends on the type of transistor. Non-limiting examples of suitable work function metals 1202 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 1202 may be deposited by a suitable deposition process, for example, CVD, PECVD, PVD, plating, thermal or e-beam evaporation, and sputtering.

Figure 13B:
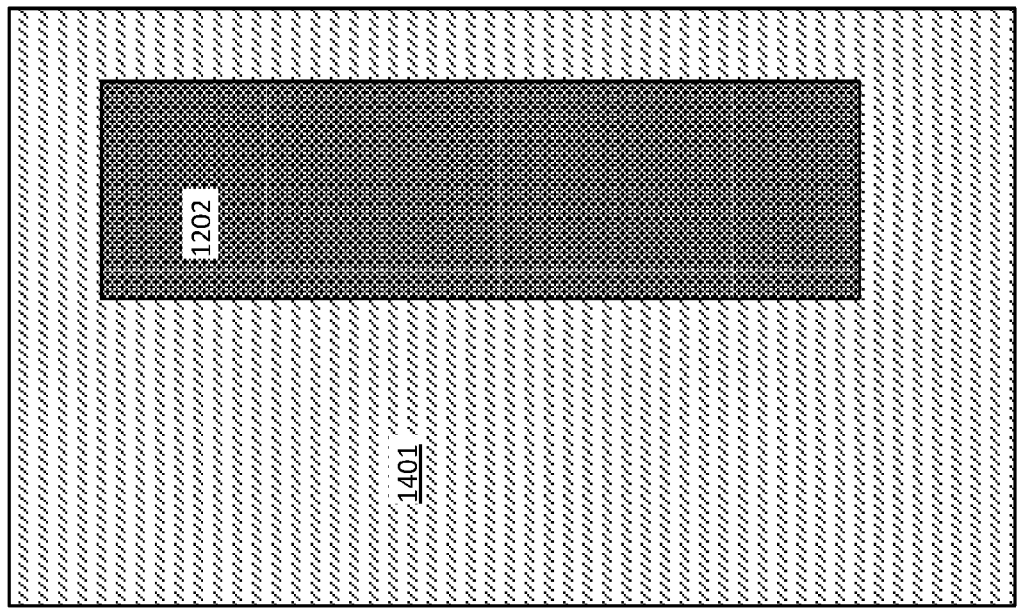
FIGS. 13A and 13B are a cross-sectional side view and a top view, respectively, after filling with a metal gate material and planarizing the metal gate material.
Figure 13A:
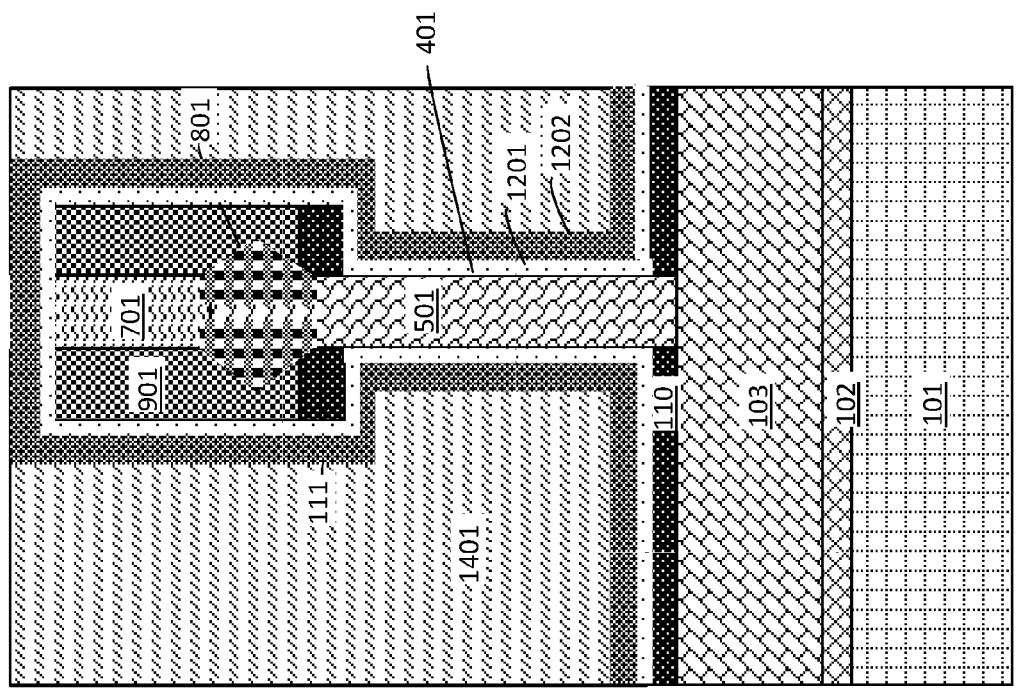

FIGS. 13A and 13B are a cross-sectional side view and a top view, respectively, after filling with a metal gate material 1401 and planarizing the metal gate material 1401. The metal gate material 1401 is a conductive gate metal that is deposited over the gate dielectric material(s) 1201 and work function metals 1202 to form the gate stack. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal material 1401.

Figure 14B:
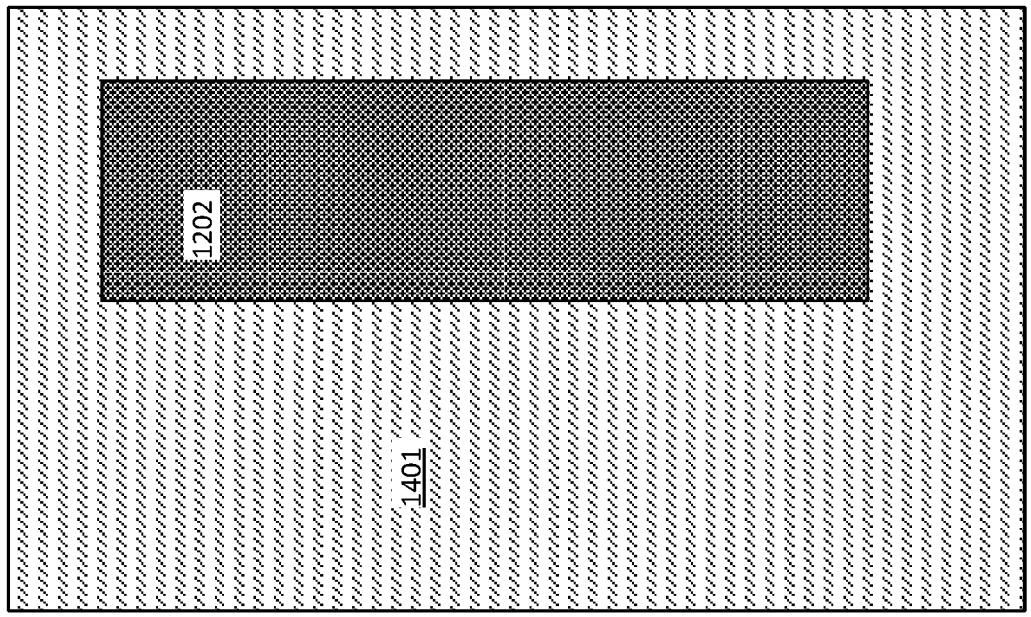
FIGS. 14A and 14B are a cross-sectional side view and a top view, respectively, after partially recessing the metal gate material.
Figure 14A:
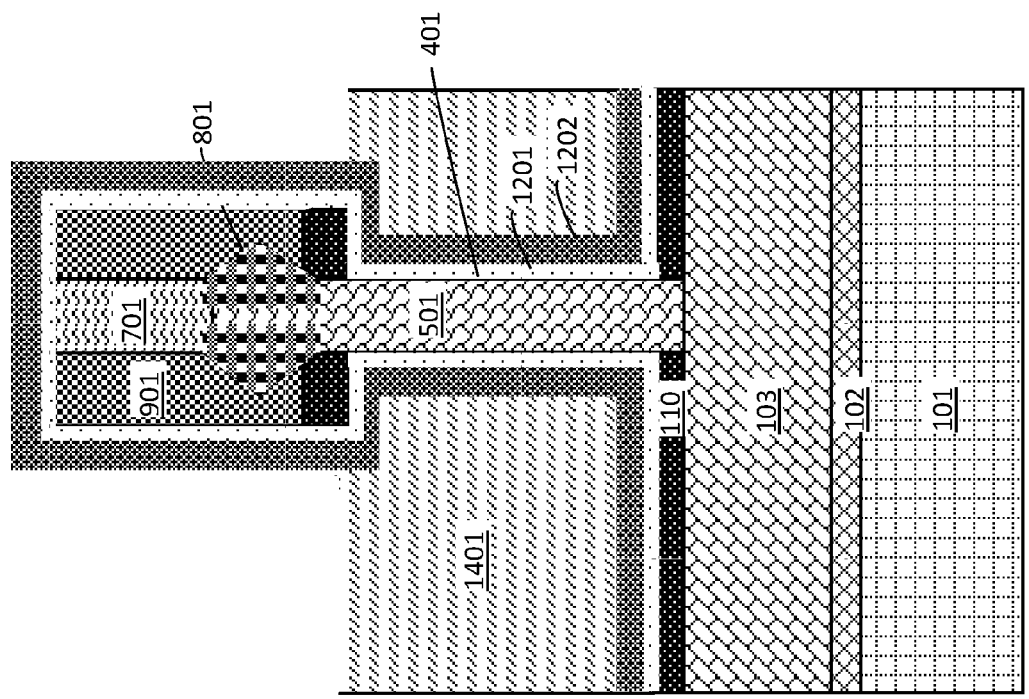

FIGS. 14A and 14B are a cross-sectional side view and a top view, respectively, after partially recessing the metal gate material 1401. The metal gate material 1401 is partially recessed by an etch process, for example, a reactive ion etch process.

Figure 15B:
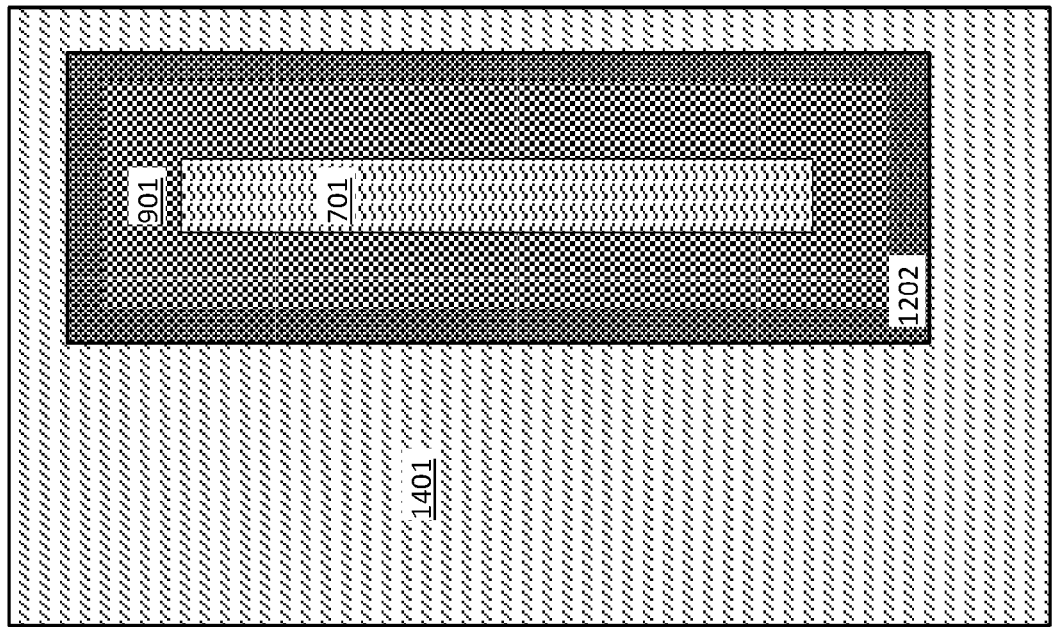
FIGS. 15A and 15B are a cross-sectional side view and a top view, respectively, after etching the gate dielectric material and the work function metal.
Figure 15A:
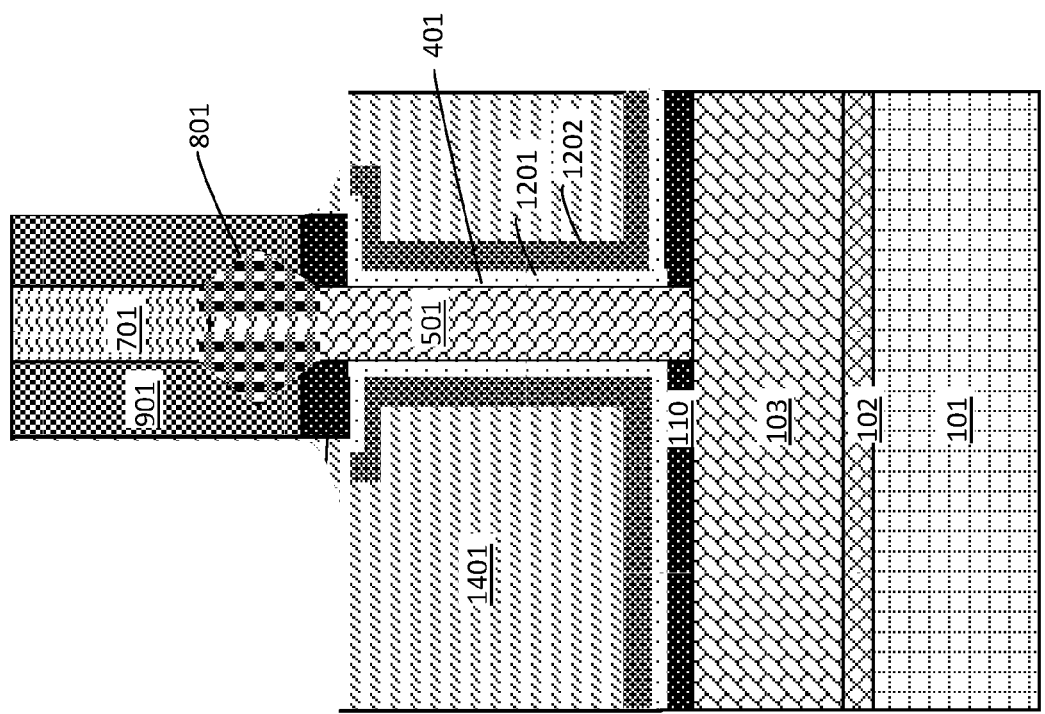

FIGS. 15A and 15B are a cross-sectional side view and a top view, respectively, after etching the gate dielectric material 1201 and the work function metal 1202. An anisotropic etch is performed such to recess the gate dielectric material 1201 and the work function metal 1202 down to the level of the metal gate material 1401. The anisotropic etch may be a RIE process.

FIGS. 16A and 16B are a cross-sectional side view and a top view, respectively, after performing gate lithography and etching to form the gate 1601. A mask may be disposed on the metal gate material 1401 and subsequently patterned. The pattern is transferred into the metal gate material 1401 to remove a portion of the metal gate material 1401 and define the gate 1601. In addition, the gate dielectric material 1201 and work function metal 1202 are also etched during this step. A combination of RIE processes may be performed. A portion of the first spacer 110 is arranged between the gate stack of the gate 1601 and the doped source 103.

Figure 17B:
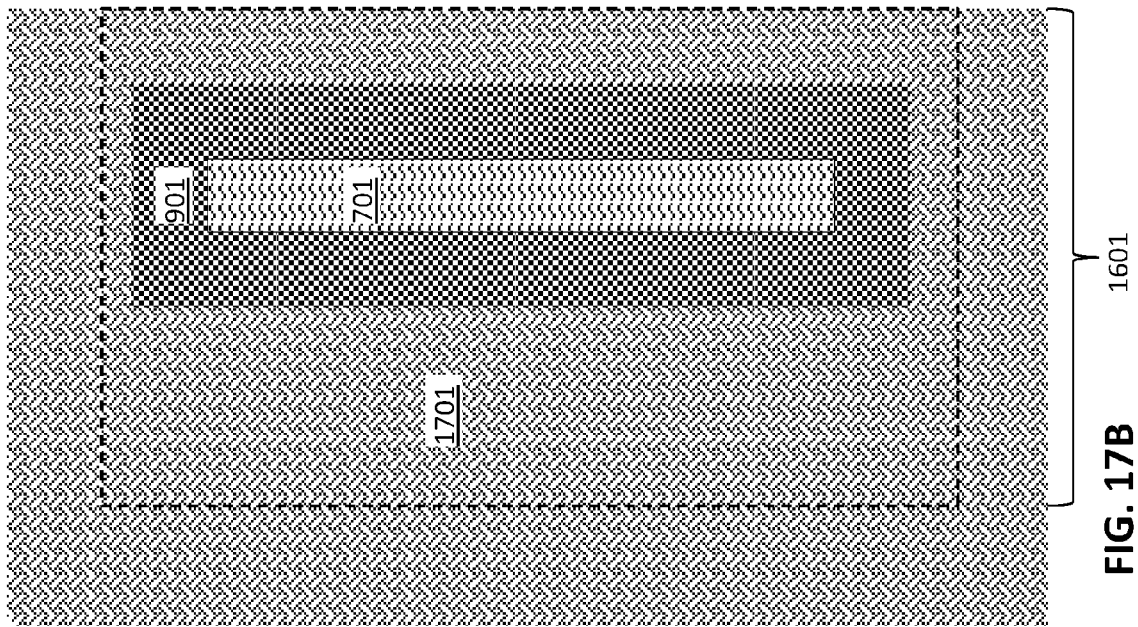
FIGS. 17A and 17B are a cross-sectional side view and a top view, respectively, after depositing an interlayer dielectric (ILD) on the gate and planarizing.
Figure 17A:
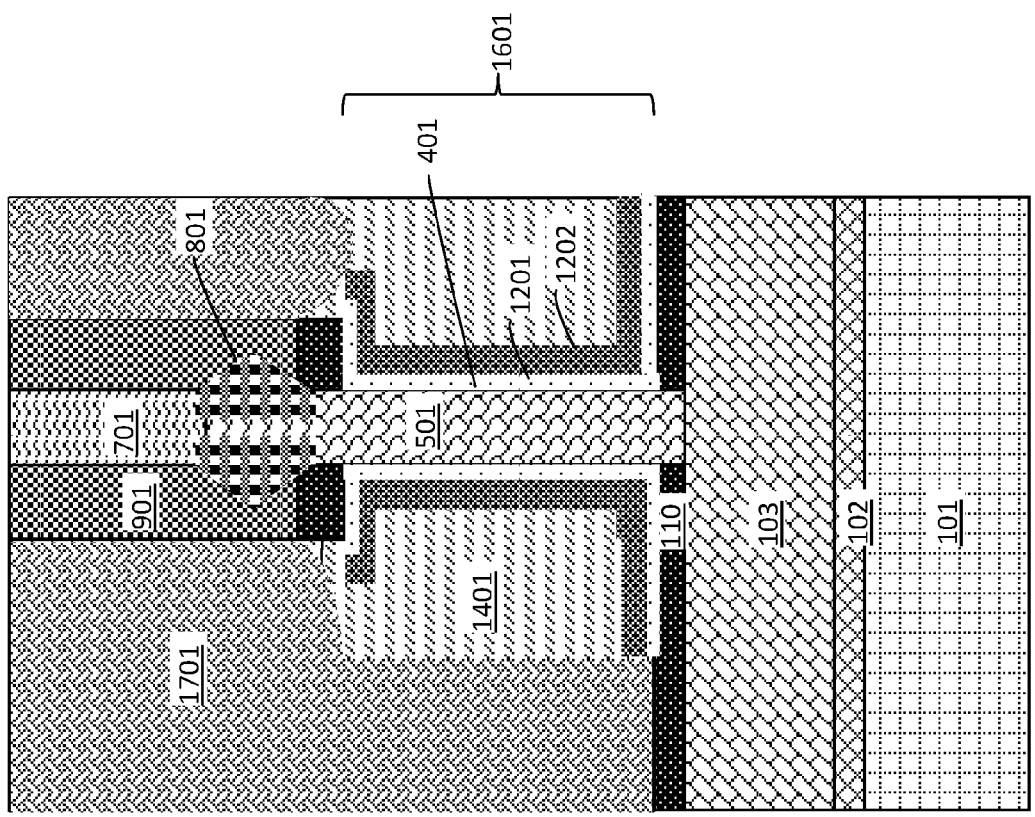

FIGS. 17A and 17B are a cross-sectional side view and a top view, respectively, after depositing an interlayer dielectric (ILD) 1701 on the gate 1601 and planarizing. The ILD 1701 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD layer 1701 is deposited by a deposition process, including, but not limited to CVD, PVD, plasma enhanced CVD, atomic layer deposition (ALD), evaporation, chemical solution deposition, or like processes.

Figure 18B:
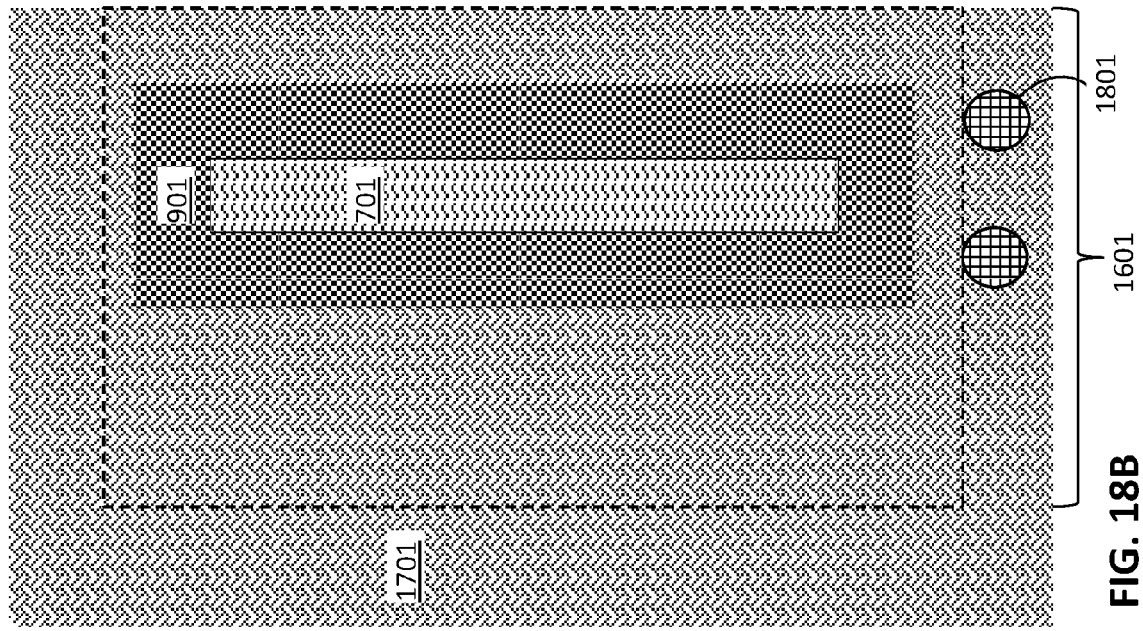
FIGS. 18A and 18B are a cross-sectional side view and a top view, respectively, after forming source contacts.
Figure 18A:
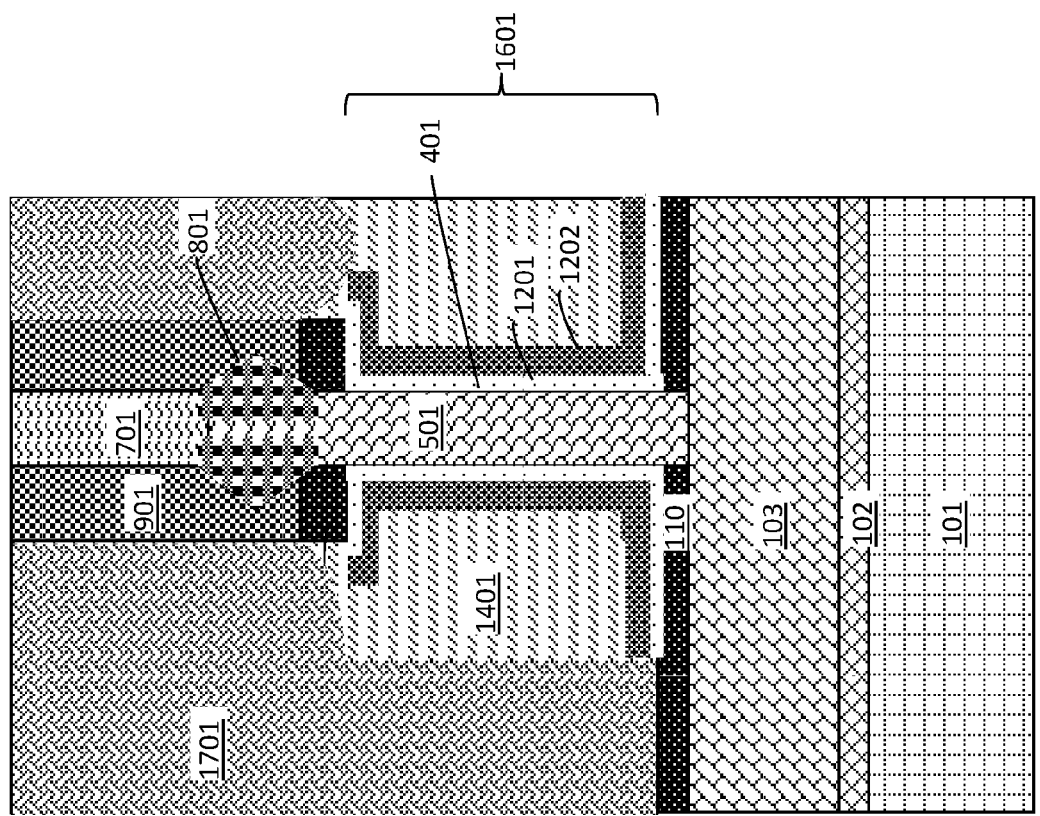

FIGS. 18A and 18B are a cross-sectional side view and a top view, respectively, after forming one or more source contacts 1801 over the doped source 103. The source contacts 1801 extend through the ILD 1701 and first spacer 110 to the doped source 110 and are formed within a trench. To remove the ILD 1701 and form the source trenches, a resist, such as a photoresist, may be deposited and patterned. An etch process, such as a RIE, may be performed using the patterned resist as an etch mask to remove the ILD 1701 and first spacer 110 until the doped source 103 is exposed. The source trenches are filled with a conductive material or a combination of conductive materials. The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1701.

Figure 19B:
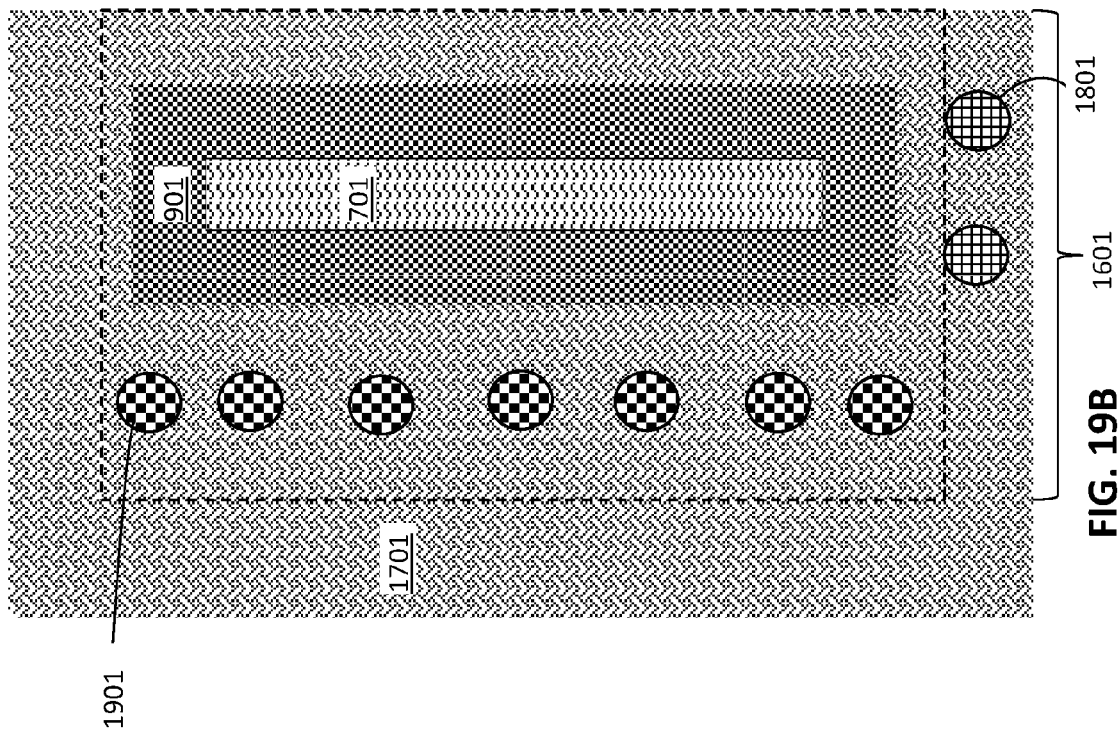
FIGS. 19A and 19B are a cross-sectional side view and a top view, respectively, after forming gate contacts.
Figure 19A:
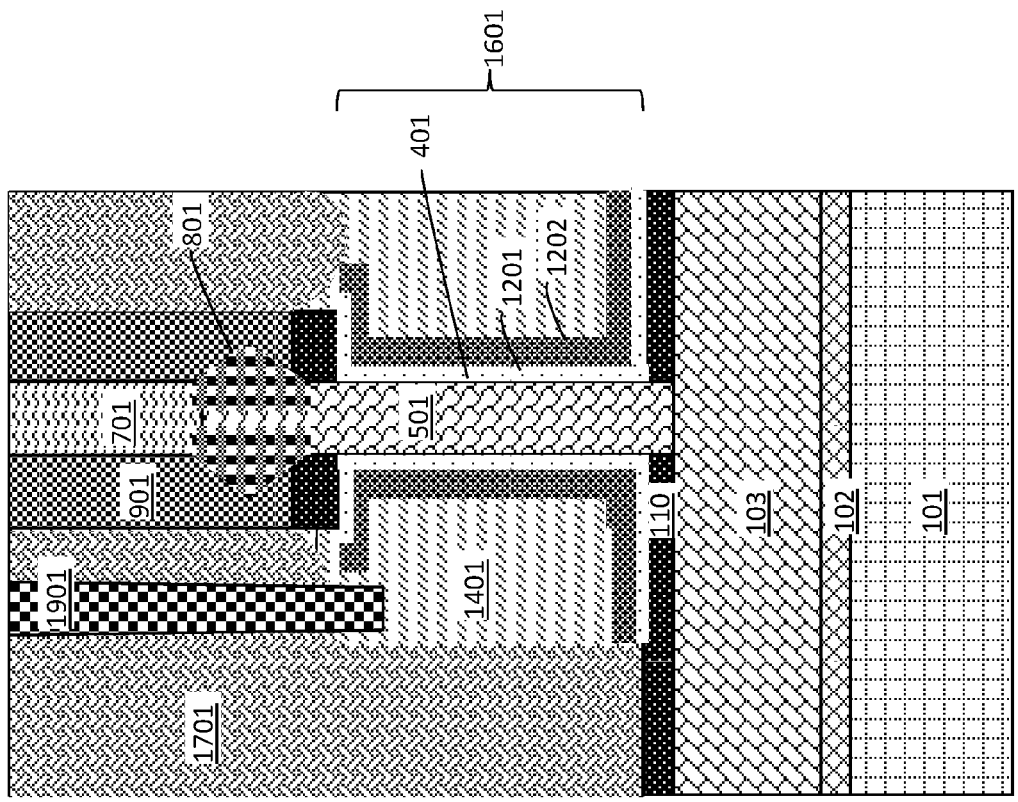

FIGS. 19A and 19B are a cross-sectional side view and a top view, respectively, after forming one or more gate contacts 1901. The gate contacts 1901 extend from the surface of the ILD 1701 to the gate 1601. The gate contacts 1901 are formed by patterning a trench in the ILD 1701. To remove the ILD 1701 and form the gate contact trenches, a resist, such as a photoresist, may be deposited and patterned. An etch process, such as a RIE, may be performed using the patterned resist as an etch mask to remove the ILD 1701 until the gate 1601 is exposed. The gate contact trenches are filled with a conductive material or a combination of conductive materials. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1701.

FIGS. 20A and 20B are a cross-sectional side view and a top view, respectively, after forming on or more drain contacts 2001. The drain contacts 2001 extend between the spacers 901 to the epitaxial growth 801 forming the drain. The dielectric material 701 is removed over the epitaxial growth 801 to form a drain contact trench. To remove the dielectric material 701 and form the drain contact trenches, a resist, such as a photoresist, may be deposited and patterned. An etch process, such as a RIE, may be performed using the patterned resist as an etch mask to remove the dielectric material 701 until the epitaxial growth 801 is exposed. The drain contact trenches are filled with a conductive material or a combination of conductive materials. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1701.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical transistor, comprising:
   a source arranged on a substrate, the source being a doped region on the substrate comprising a first dopant, and a counter-doped layer comprising a second dopant that is different than the first dopant is arranged between the doped region and the substrate;
   a channel region extending over the source and comprising an epitaxial growth;
   a drain comprising an epitaxial growth arranged on the channel region, the channel region extending from the source to the drain;
   a gate disposed on and around the channel region; and
   a spacer arranged on the gate and around the drain.

2. The vertical transistor of claim 1, wherein the channel region comprises an epitaxial growth.

3. The vertical transistor of claim 1, further comprising a spacer arranged between the source and the gate.

4. The vertical transistor of claim 1, further comprising a dielectric spacer arranged between the gate and the spacer.

5. The vertical transistor of claim 1, wherein the spacer has a width in a range from about 5 to about 50 nm.

* * * * *